US012690370B2

(12) United States Patent
Shin et al.

(10) Patent No.: US 12,690,370 B2
(45) Date of Patent: Jul. 21, 2026

(54) DISPLAY APPARATUS INCLUDING CORNER DISPLAY AREA

(71) Applicant: SAMSUNG DISPLAY CO., LTD.,
Yongin-si (KR)

(72) Inventors: Hosik Shin, Yongin-si (KR); Sangwoo Kim, Yongin-si (KR); Gyehwan Lim, Yongin-si (KR)

(73) Assignee: SAMSUNG DISPLAY CO., LTD.,
Gyeonggi-Do (KR)

( * ) Notice: Subject to any disclaimer, the term of this patent is extended or adjusted under 35 U.S.C. 154(b) by 430 days.

(21) Appl. No.: 18/130,553

(22) Filed: Apr. 4, 2023

(65) Prior Publication Data

US 2023/0320177 A1 Oct. 5, 2023

(30) Foreign Application Priority Data

May 16, 2022 (KR) ........................ 10-2022-0059834
Aug. 17, 2022 (KR) ........................ 10-2022-0102921

(51) Int. Cl.
*H10K 59/80* (2023.01)
*H10K 59/179* (2023.01)
*H10K 50/844* (2023.01)
*H10K 102/00* (2023.01)

(52) U.S. Cl.
CPC ......... *H10K 59/873* (2023.02); *H10K 59/179* (2023.02); *H10K 50/844* (2023.02); *H10K 2102/351* (2023.02)

(58) Field of Classification Search
CPC .. H10K 59/873; H10K 59/179; H10K 59/123; H10K 59/131; H10K 59/8723; H10K 77/10
See application file for complete search history.

(56) References Cited

U.S. PATENT DOCUMENTS

| | | | |
|---|---|---|---|
| 10,939,547 B2 | 3/2021 | Lee et al. | |
| 11,659,742 B2 | 5/2023 | Won et al. | |
| 2002/0154264 A1* | 10/2002 | Suzuki | G02F 1/1339 |
| | | | 349/153 |

(Continued)

FOREIGN PATENT DOCUMENTS

| | | | | |
|---|---|---|---|---|
| CN | 112133733 A | 12/2020 | | |
| CN | 114188373 A | * 3/2022 | ........... | H10K 59/873 |

(Continued)

*Primary Examiner* — Ida M Soward
(74) *Attorney, Agent, or Firm* — CANTOR COLBURN LLP

(57) ABSTRACT

A display apparatus includes a central area arranged at a center of a substrate, and a corner area arranged at a corner of the central area. The corner area includes a central corner area including a plurality of extension areas extending in a direction away from the central area and a first adjacent corner area and a second adjacent corner area respectively arranged at opposite sides of the central corner area. The plurality of extension areas is spaced apart from each other by a spaced area in which the substrate is arranged, and the central corner area and the first adjacent corner area are spaced apart from each other by a first penetration area in which the substrate is not arranged, and the central corner area and the second adjacent corner area are spaced apart from each other by a second penetration area in which the substrate is not arranged.

25 Claims, 20 Drawing Sheets

(56)                       References Cited

U.S. PATENT DOCUMENTS

| | | | | |
|---|---|---|---|---|
| 2021/0376038 | A1* | 12/2021 | Won | H10K 59/1213 |
| 2021/0384465 | A1* | 12/2021 | Park | H10K 59/124 |
| 2022/0013596 | A1* | 1/2022 | Kim | G06F 1/1652 |
| 2022/0069051 | A1* | 3/2022 | Lee | H10K 59/122 |
| 2022/0077242 | A1* | 3/2022 | Yoon | G06F 1/1637 |
| 2022/0077271 | A1* | 3/2022 | Lee | H10K 59/131 |
| 2022/0085327 | A1* | 3/2022 | Kim | H10K 59/873 |
| 2022/0093897 | A1* | 3/2022 | Lee | H10K 59/12 |
| 2022/0102462 | A1 | 3/2022 | Zhou et al. | |
| 2022/0149118 | A1* | 5/2022 | Kim | H10K 59/131 |
| 2022/0149303 | A1* | 5/2022 | Lee | H10K 50/844 |
| 2022/0149324 | A1* | 5/2022 | Park | H10K 59/8731 |
| 2022/0165805 | A1* | 5/2022 | Choi | H10K 59/353 |
| 2022/0209148 | A1 | 6/2022 | Park et al. | |
| 2022/0328569 | A1* | 10/2022 | Park | H10K 77/111 |
| 2023/0034664 | A1* | 2/2023 | Shin | H10K 59/122 |
| 2023/0044811 | A1 | 2/2023 | Kim et al. | |

FOREIGN PATENT DOCUMENTS

| | | | | | |
|---|---|---|---|---|---|
| KR | 1020190102123 | A | | 9/2019 | |
| KR | 1020200066014 | A | | 6/2020 | |
| KR | 1020200124352 | A | | 11/2020 | |
| KR | 20210151634 | A | * | 12/2021 | H10K 59/131 |
| KR | 1020210149279 | A | | 12/2021 | |
| KR | 20220030467 | A | * | 3/2022 | H10K 59/131 |
| KR | 20220033574 | A | * | 3/2022 | H10K 59/121 |
| KR | 20220034278 | A | * | 3/2022 | H10K 59/873 |
| KR | 20220037548 | A | * | 3/2022 | H10K 59/123 |
| KR | 20230022375 | A | | 2/2023 | |

* cited by examiner

DISPLAY APPARATUS INCLUDING CORNER DISPLAY AREA

This application claims priority to Korean Patent Applications No. 10-2022-0059834, filed on May 16, 2022, and No. 10-2022-0102921, filed on Aug. 17, 2022, and all the benefits accruing therefrom under 35 U.S.C. § 119, the content of which in their entirety is herein incorporated by reference.

BACKGROUND

1. Field

Embodiments relate to a display apparatus, in which an area for displaying an image is increased.

2. Description of the Related Art

Mobile electronic devices are being widely used. As mobile electronic devices, tablet personal computers are being broadly used recently, in addition to small electronic devices, such as mobile phones. Such mobile electronic devices include display devices in order to provide a user with various functions for visual information such as an image or a video. Recently, with miniaturization of various components for driving electronic devices, an importance of display apparatuses for electronic devices is being continually increased, and a structure to bend a flat display apparatus by a predetermined angle is being developed.

SUMMARY

Embodiments include a display panel and a display apparatus, in which reliability is improved, and an area for displaying an image is increased.

Additional features will be set forth in part in the description which follows and, in part, will be apparent from the description, or may be learned by practice of the presented embodiments of the disclosure.

According to embodiments, a display apparatus includes a substrate, a central area including a first display element and arranged at a center of the substrate, and a corner area including a second display element and arranged at a corner of the central area. The corner area includes a central corner area including a plurality of extension areas extending in a direction away from the central area and a first adjacent corner area and a second adjacent corner area respectively arranged at opposite sides of the central corner area, the plurality of extension areas is spaced apart from each other by a spaced area in which the substrate is arranged and which does not connect the plurality of extension areas, and the central corner area and the first adjacent corner area are spaced apart from each other by a first penetration area in which the substrate is not arranged and which does not connect the central corner area and the first adjacent corner area, and the central corner area and the second adjacent corner area are spaced apart from each other by a second penetration area in which the substrate is not arranged and which does not connect the central corner area and the second adjacent corner area.

In an embodiment, a width of each of the first penetration area and the second penetration area may be greater than a width of the spaced area.

In an embodiment, the display apparatus may further include an encapsulation layer arranged on the first and second display elements and including an inorganic encapsulation layer and an organic encapsulation layer. The organic encapsulation layer may be unitary in the central area and include separated portions in the central corner area and the first and second adjacent corner areas.

In an embodiment, the display apparatus may further include an inorganic insulating layer arranged between the substrate and the first and second display elements, a first organic insulating layer arranged between the inorganic insulating layer and the first and second display elements, and a second organic insulating layer arranged between the first organic insulating layer and the first and second display elements. The inorganic insulating layer, the first organic insulating layer, and the second organic insulating layer may not be connected in the first and second penetration areas and the spaced area.

In an embodiment, the second display element may include a plurality of display elements, the plurality of display elements may be arranged in the plurality of extension areas, and in each of the plurality of extension areas, a first organic pattern arranged on the second organic insulating layer and surrounding the plurality of display elements in a plan view and a second organic pattern arranged on the second organic insulating layer to be apart from the first organic pattern and surrounding the first organic pattern in the plan view may be arranged.

In an embodiment, a thickness of the second organic pattern may be greater than a thickness of the first organic pattern.

In an embodiment, the second organic patterns surrounding extension areas that are most adjacent to each other from among the plurality of extension areas may be apart from each other in the spaced area.

In an embodiment, in the plan view, a first inorganic pattern arranged between the plurality of display elements and the first organic pattern and a second inorganic pattern arranged between the first organic pattern and the second organic pattern may further be arranged in each of the plurality of extension areas, and based on a circumferential surface of the substrate, a height of each of the first and second organic patterns may be greater than a height of each of the first and second inorganic patterns.

In an embodiment, in each of the plurality of extension areas, a first inorganic encapsulation layer, an organic encapsulation layer, and a second inorganic encapsulation layer may be sequentially stacked on the plurality of display elements. The organic encapsulation layer may be arranged in the second organic pattern, and organic encapsulation layers adjacent to each other in the plurality of extension areas may not be connected to each other.

In an embodiment, in the spaced area, the first inorganic encapsulation layer and the second inorganic encapsulation layer may be arranged on the substrate connecting extension areas that are most adjacent to each other among the plurality of extension areas, and the first inorganic encapsulation layer and the second inorganic encapsulation layer may directly contact each other.

In an embodiment, a neutral plane adjustment layer may further be arranged above the encapsulation layer of each of the plurality of extension areas and on the substrate of the spaced area, and the neutral plane adjustment layer may include a material having a higher modulus than a modulus of a material of the encapsulation layer.

In an embodiment, between the substrate of the spaced area and the neutral plane adjustment layer, an inorganic layer may further be arranged.

In an embodiment, the display apparatus may further include a line arranged in each of the plurality of extension areas and an additional connection line connected to the line and arranged on the substrate of the spaced area.

In an embodiment, the additional connection line may be arranged in a direction crossing a longitudinal direction of an extension area of the plurality of extension areas.

In an embodiment, the display apparatus may further include a middle corner area arranged between the central area and the corner area and including a third display element. The encapsulation layer may further be arranged on the third display element, and the organic encapsulation layer may be unitary in the central area and the middle corner area and include the separated portions in the central corner area and the first and second adjacent corner areas.

According to embodiments, a display apparatus includes a substrate, a central area including a first display element and arranged at a center of the substrate, and a corner area including a second display element and arranged at a corner of the central area. The corner area includes a central corner area including a plurality of extension areas extending in a direction away from the central area and a first adjacent corner area and a second adjacent corner area respectively arranged at opposite sides of the central corner area, the plurality of extension areas includes at least a first extension area, a second extension area, and a third extension area. The first extension area and the second extension area are spaced apart from each other by a first spaced area in which the substrate is arranged and which does not connect the first extension area and the second extension area, and the second extension area and the third extension area are spaced apart from each other by a second spaced area in which the substrate is not arranged and which does not connect the second extension area and the third extension area, and the central corner area and the first adjacent corner area are spaced apart from each other by a first penetration area in which the substrate is not arranged and which does not connect the central corner area and the first adjacent corner area, and the central corner area and the second adjacent corner area are spaced apart from each other by a second penetration area in which the substrate is not arranged and which does not connect the central corner area and the second adjacent corner area.

In an embodiment, a width of each of the first penetration area and the second penetration area may be greater than a width of the first spaced area and a width of the second spaced area.

The width of the first spaced area may be greater than the width of the second spaced area.

In an embodiment, the display apparatus may further include an encapsulation layer arranged on the first and second display elements and including an inorganic encapsulation layer and an organic encapsulation layer. The organic encapsulation layer may be arranged unitary in the central area and include separated portions in the central corner area and the first and second adjacent corner areas.

In an embodiment, the display apparatus may further include an encapsulation layer arranged on the first and second display elements and including an inorganic encapsulation layer and an organic encapsulation layer. The organic encapsulation layer may be unitary in the central area and include separated portions in the central corner area and the first and second adjacent corner areas, and the inorganic encapsulation layer may be arranged on the substrate in the first spaced area and may be connected in the central corner area and the first and second adjacent corner areas.

In an embodiment, a neutral plane adjustment layer may further be arranged above the encapsulation layer of each of the plurality of extension areas and on the substrate of the first spaced area, and the neutral plane adjustment layer may include a material having a higher modulus than a modulus of a material of the encapsulation layer.

In an embodiment, the display apparatus may further include a line arranged in each of the plurality of extension areas and an additional connection line connected to the line and arranged on the substrate of the first spaced area.

In an embodiment, the additional connection line may be arranged in a direction crossing a longitudinal direction of an extension area of the plurality of extension areas.

In an embodiment, the display apparatus may further include a middle corner area arranged between the central area and the corner area and including a third display element. An encapsulation layer may further be arranged on the third display element, and the organic encapsulation layer may be unitary in the central area and the middle corner area and include separated portions in the central corner area and the first and second adjacent corner areas.

According to embodiments, a display apparatus includes a substrate, an inorganic insulating layer arranged on the substrate, a first organic insulating layer arranged on the inorganic insulating layer, a second organic insulating layer arranged on the first organic insulating layer. A plurality of patterns spaced apart from each other by a plurality of corner holes is arranged in the second organic insulating layer, a first pixel array to a fourth pixel array arranged on the second organic insulating layer and including a plurality of display elements, a first organic pattern surrounding each of the first to fourth pixel arrays, a plurality of second organic patterns surrounding the first organic pattern and apart from the first organic pattern, and an organic encapsulation layer arranged in a second organic pattern of the plurality of second organic patterns and separately arranged for each of the first to fourth pixel arrays. A third organic pattern on the substrate is further arranged between adjacent second organic patterns of the first pixel array and the second pixel array among the plurality of second organic patterns, the substrate is not arranged between the adjacent second organic patterns of the second pixel array and the third pixel array, and the substrate is arranged and the third organic pattern is not arranged between the adjacent second organic patterns of the third pixel array and the fourth pixel array. A distance between the second pixel array and the third pixel array is greater than a distance between the third pixel array and the fourth pixel array.

BRIEF DESCRIPTION OF THE DRAWINGS

The above and other features and advantages of illustrative embodiments of the disclosure will be more apparent from the following description taken in conjunction with the accompanying drawings, in which:

FIG. 2A is a cross-sectional view of the display apparatus of FIG. 1, taken along line A-A';

FIG. 2C is a cross-sectional view of the display apparatus of FIG. 1, taken along line C-C';

FIG. 5 is a schematic cross-sectional view of the display panel of FIG. 3, taken along line D-D';

5

Figure 3:
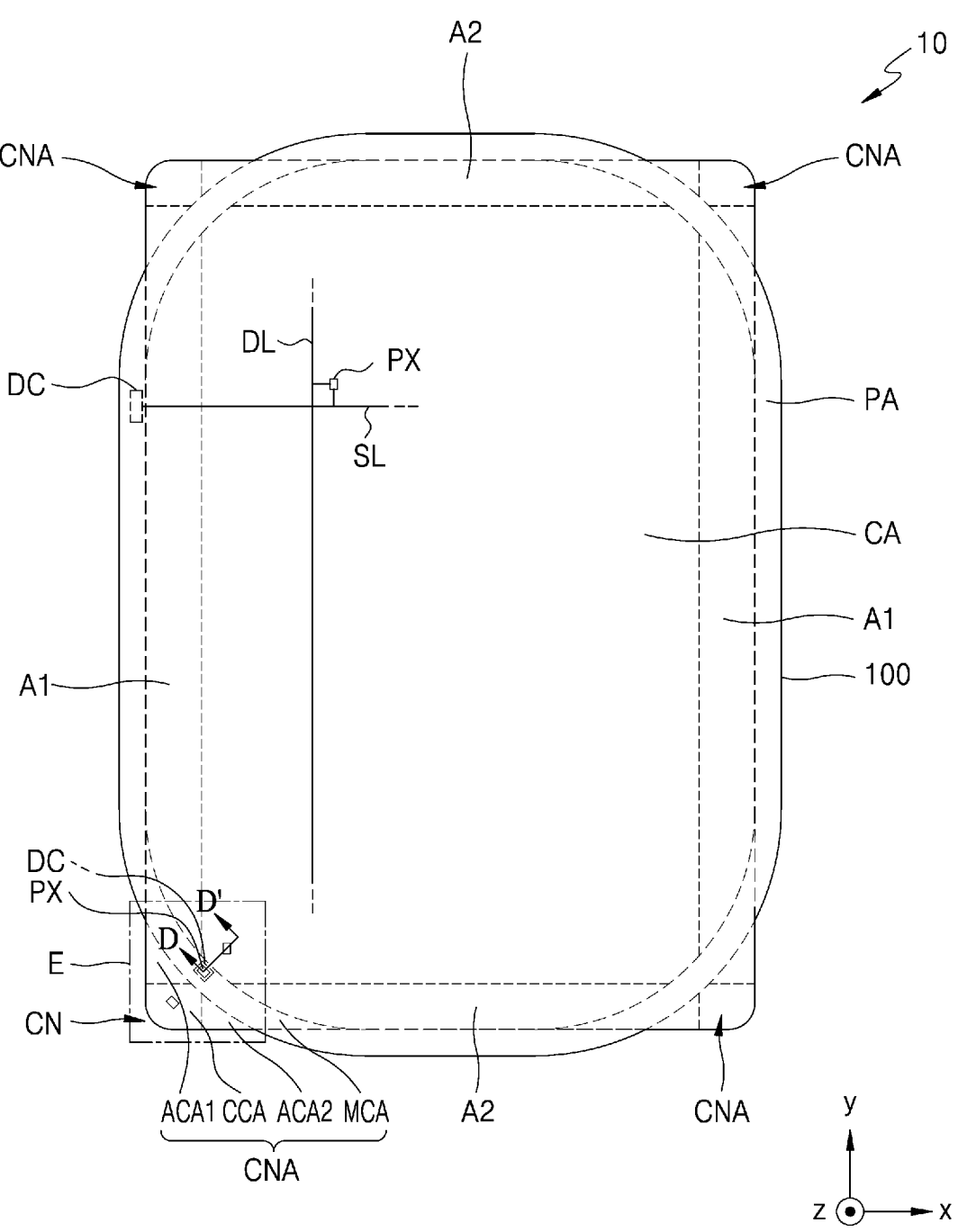
FIG. 3 is a schematic plan view of an embodiment of a display panel.
Figure 6:
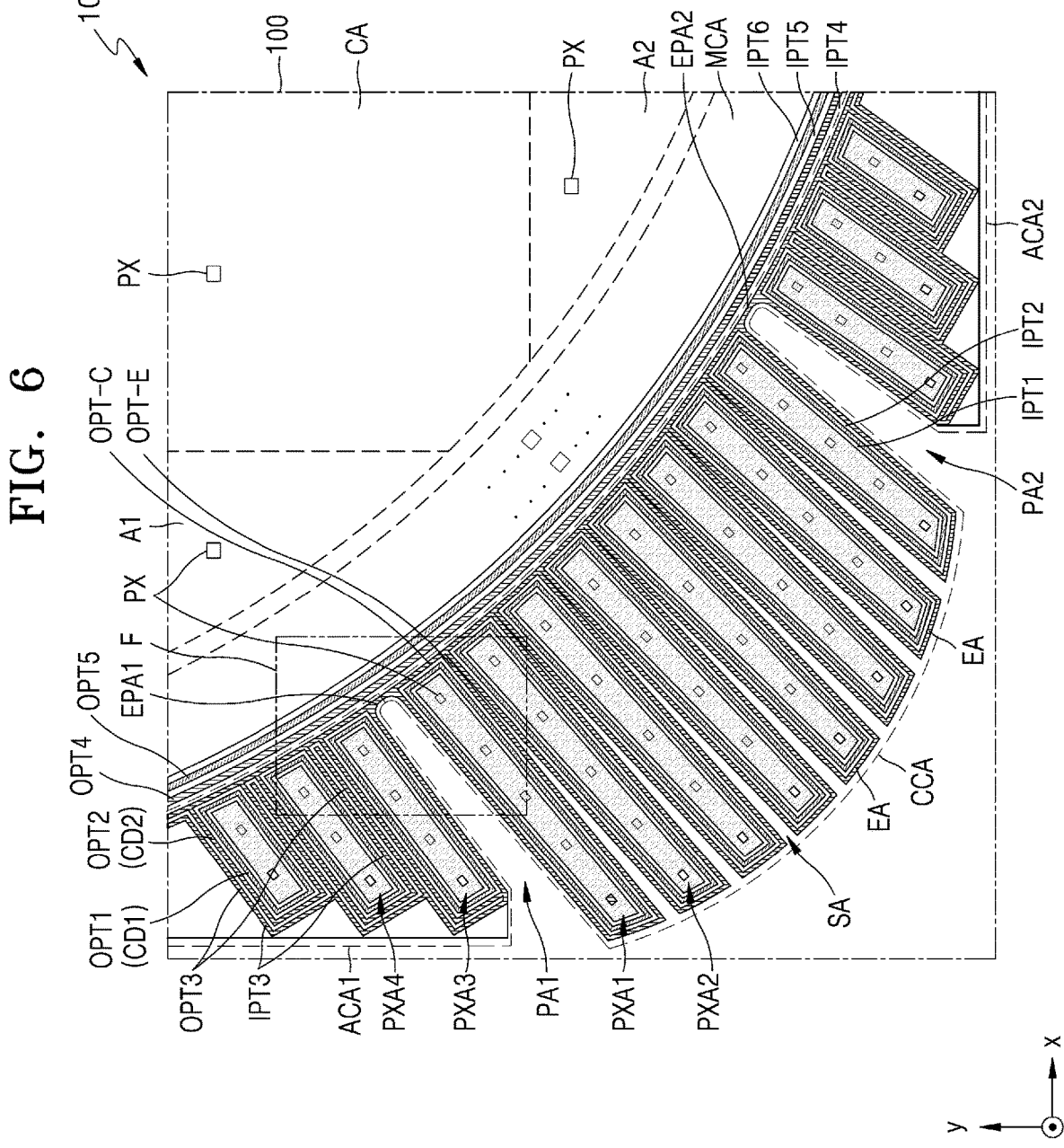
Figure 7:
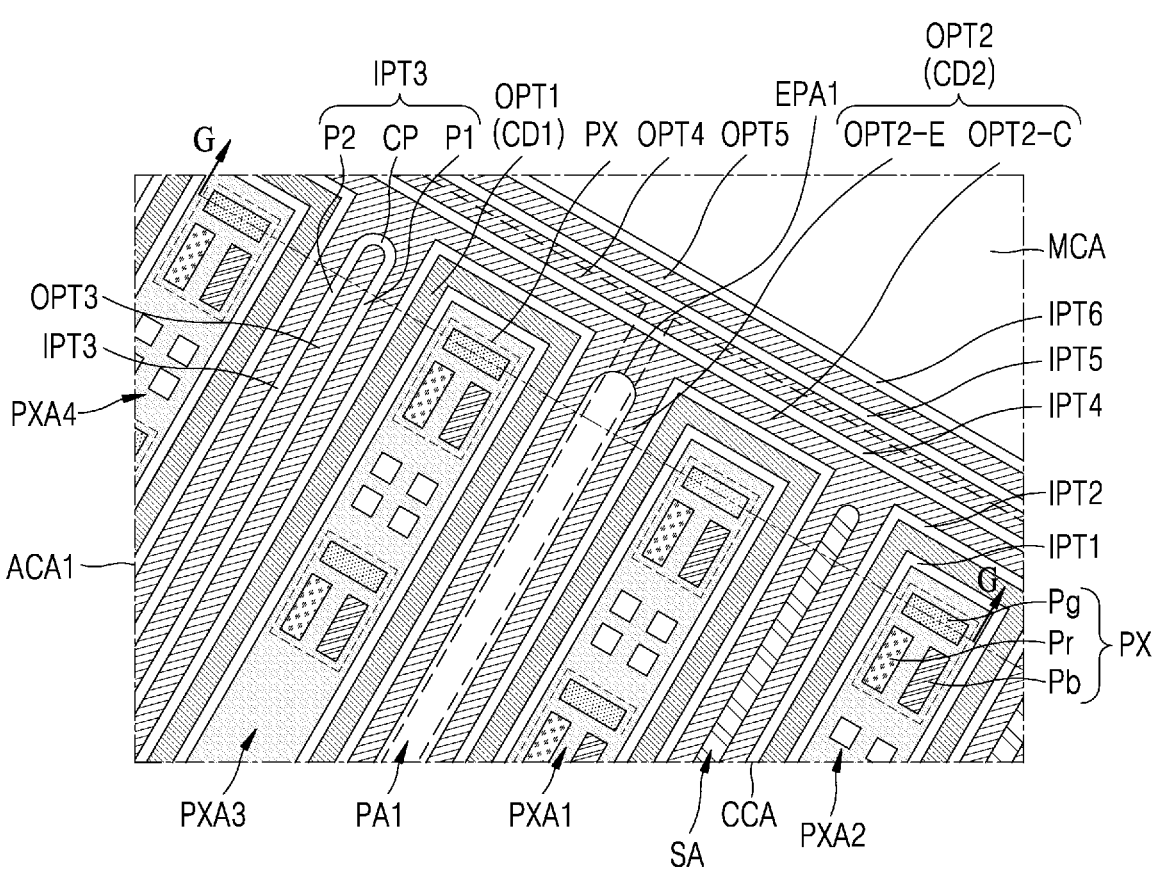
Figure 8A:
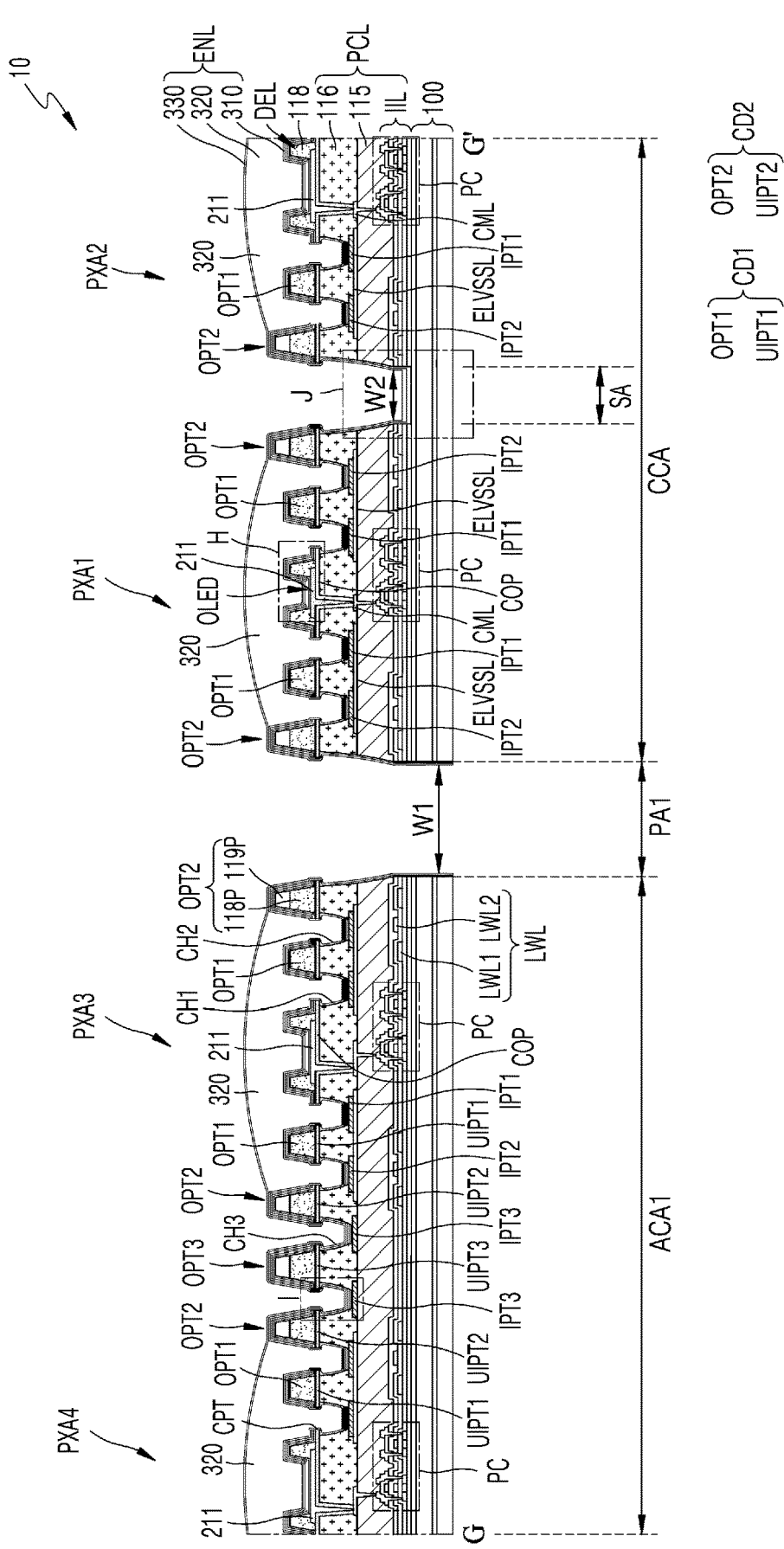
Figure 8B:
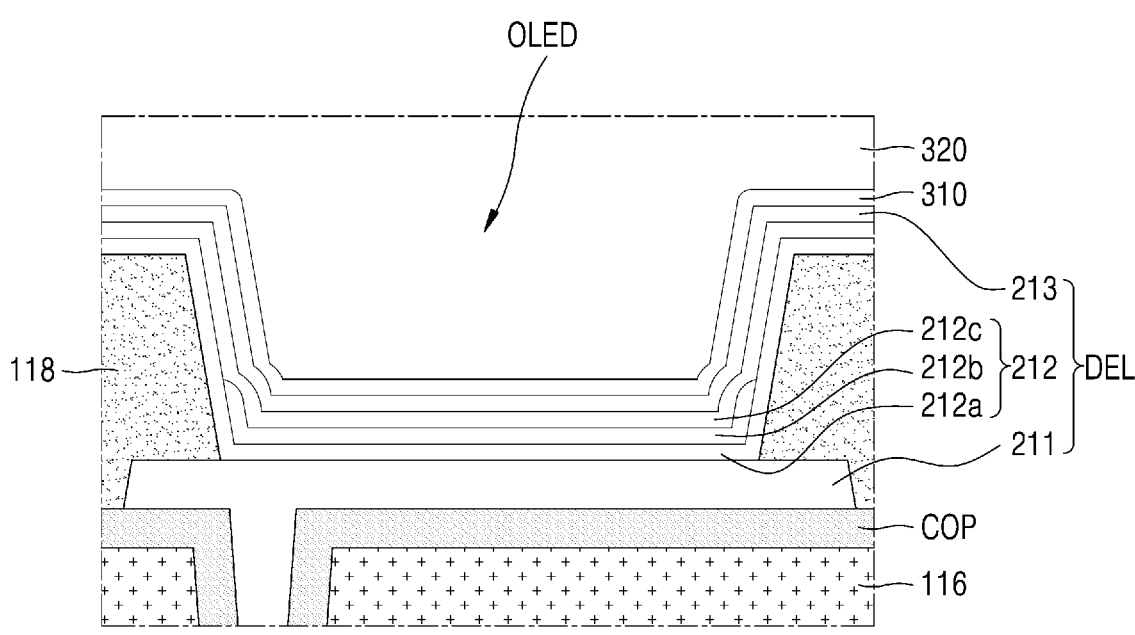
Figure 8C:
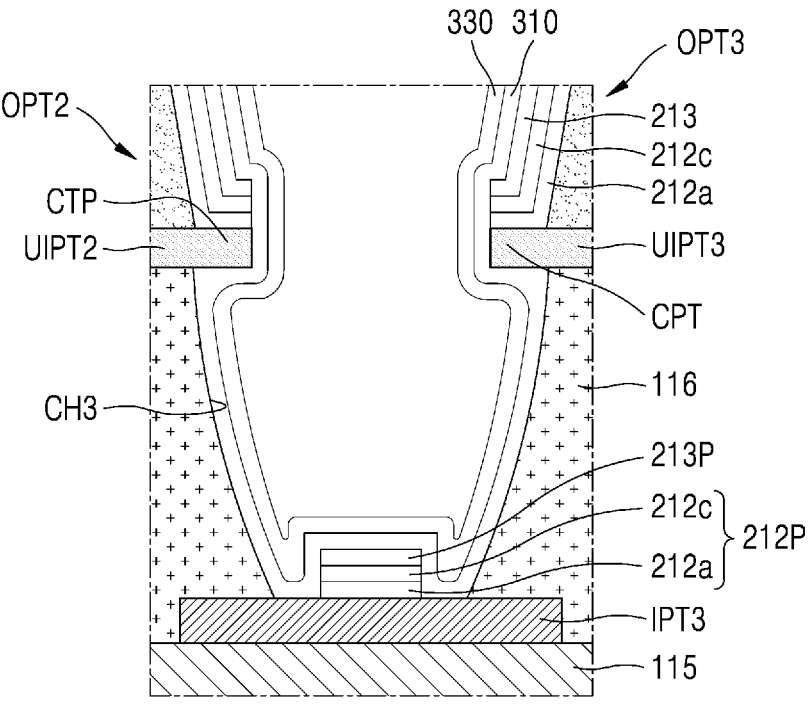
Figure 8D:
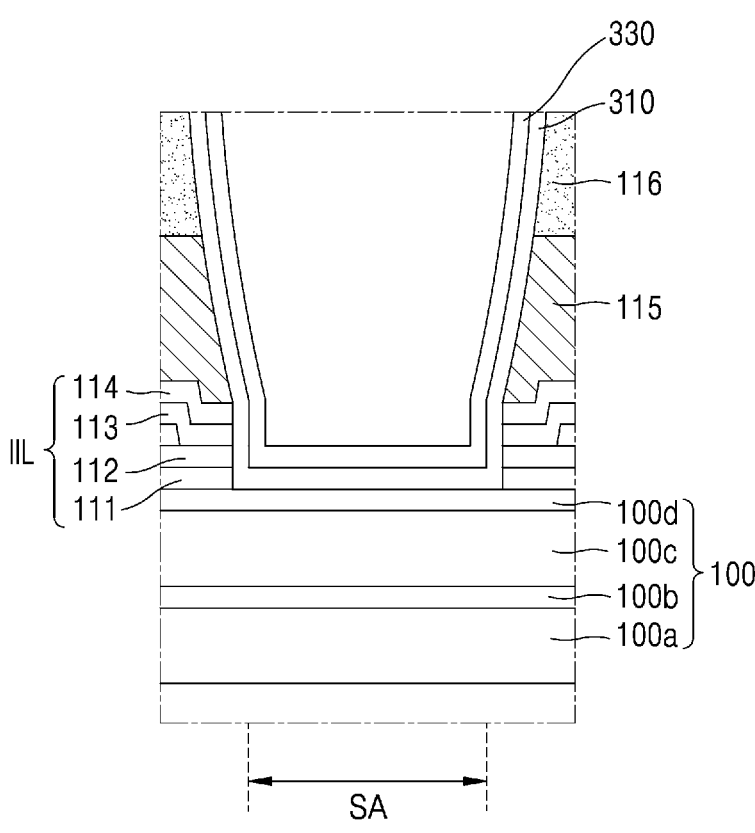
Figure 9A:
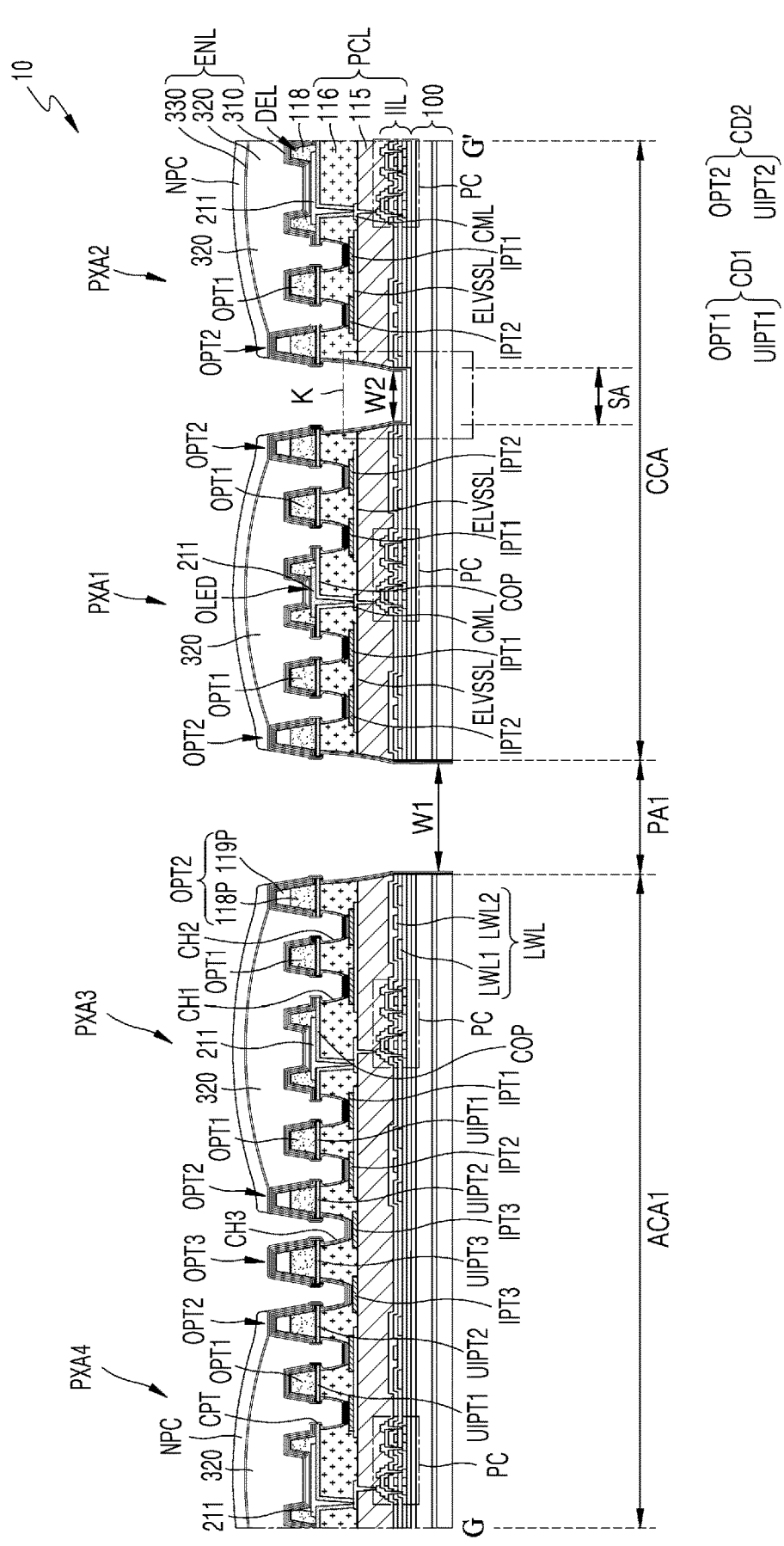
Figure 9B:
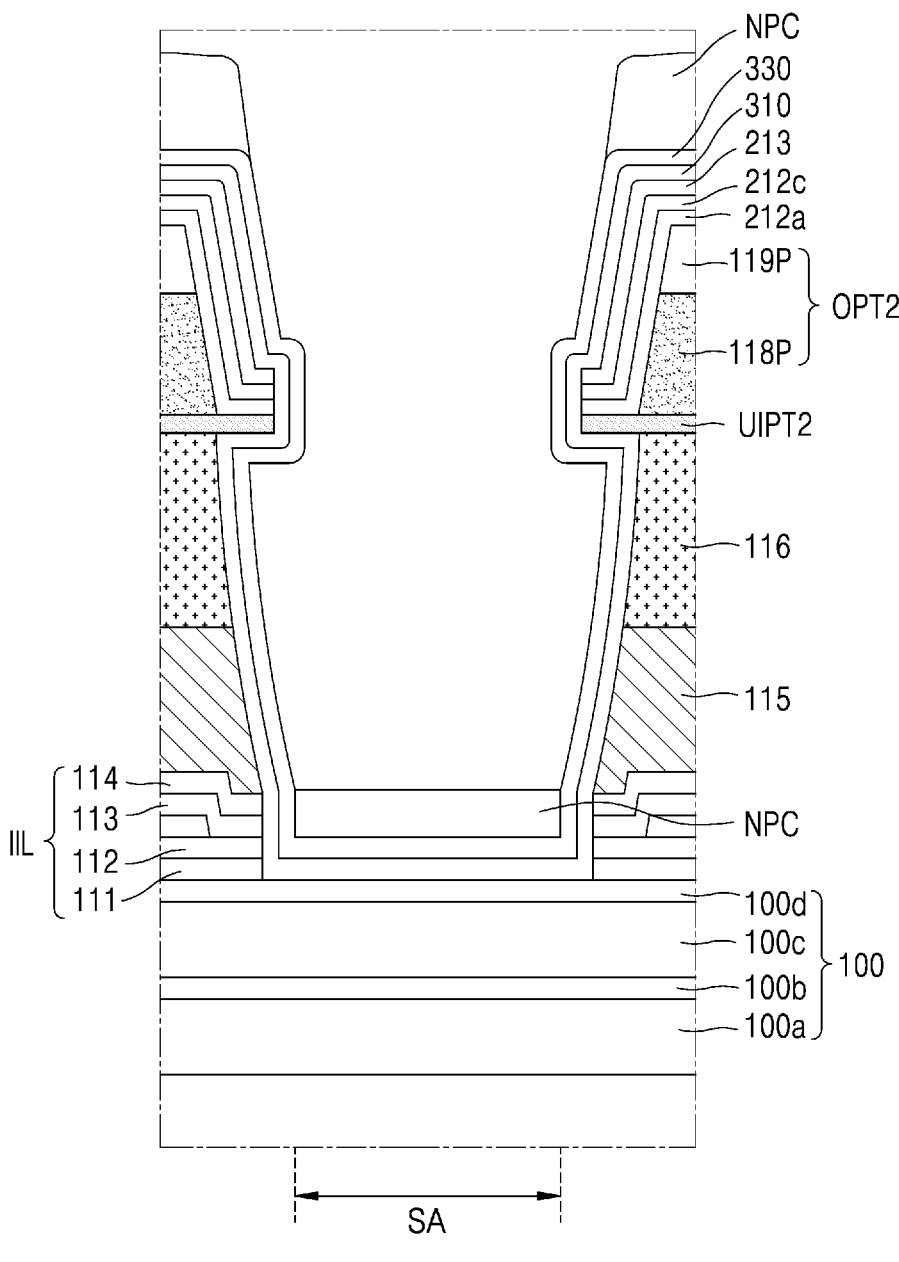
Figure 10A:
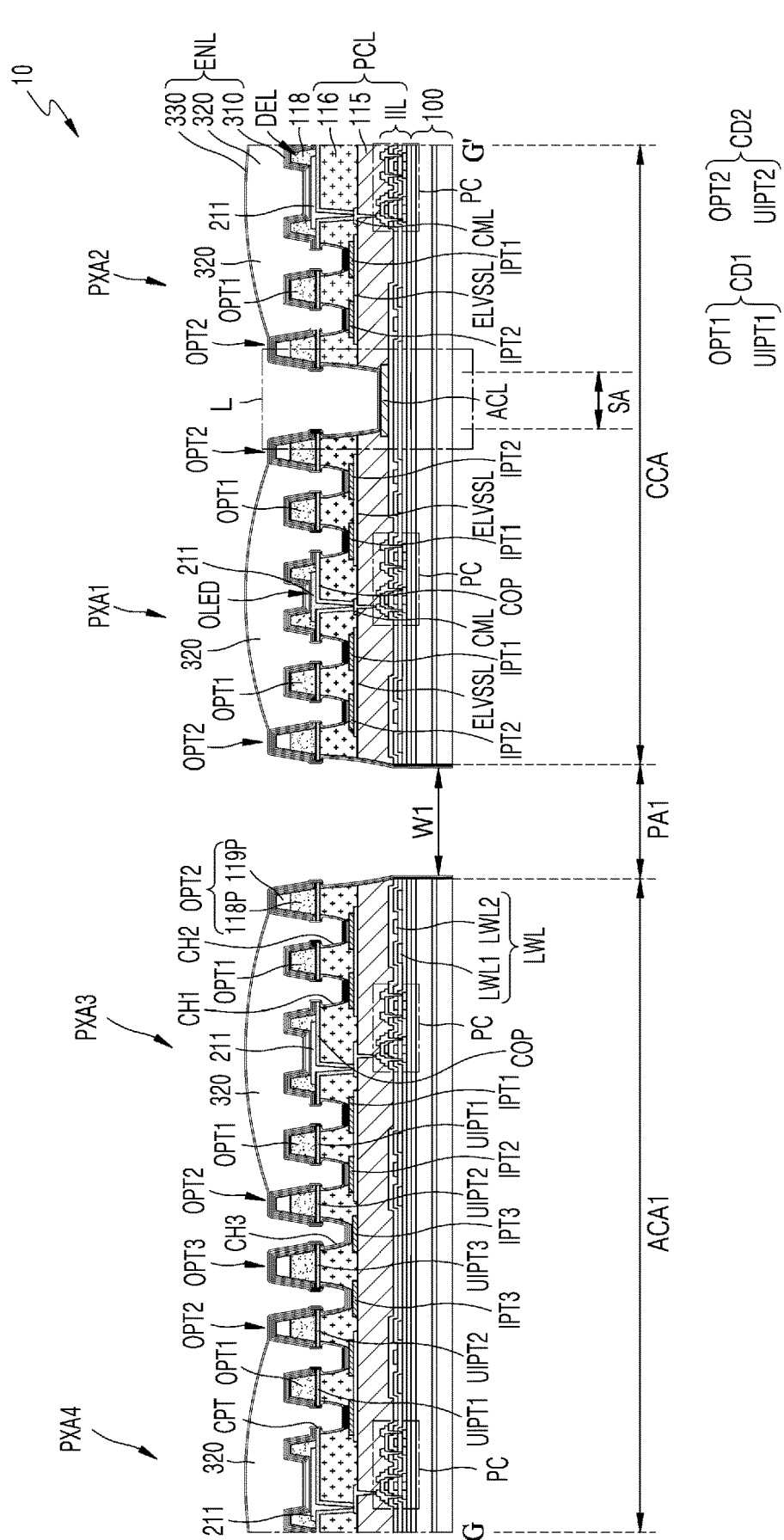
Figure 10B:
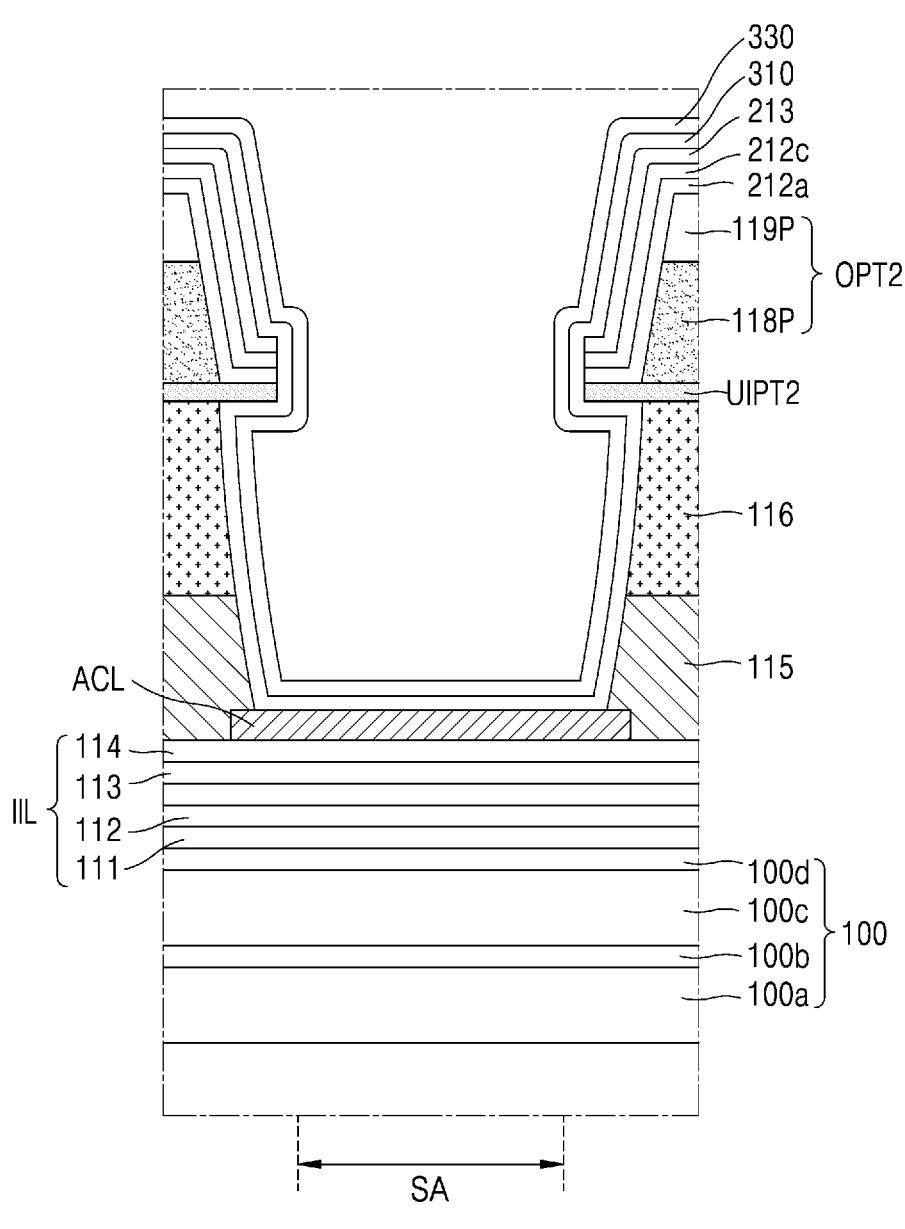
Figure 11A:
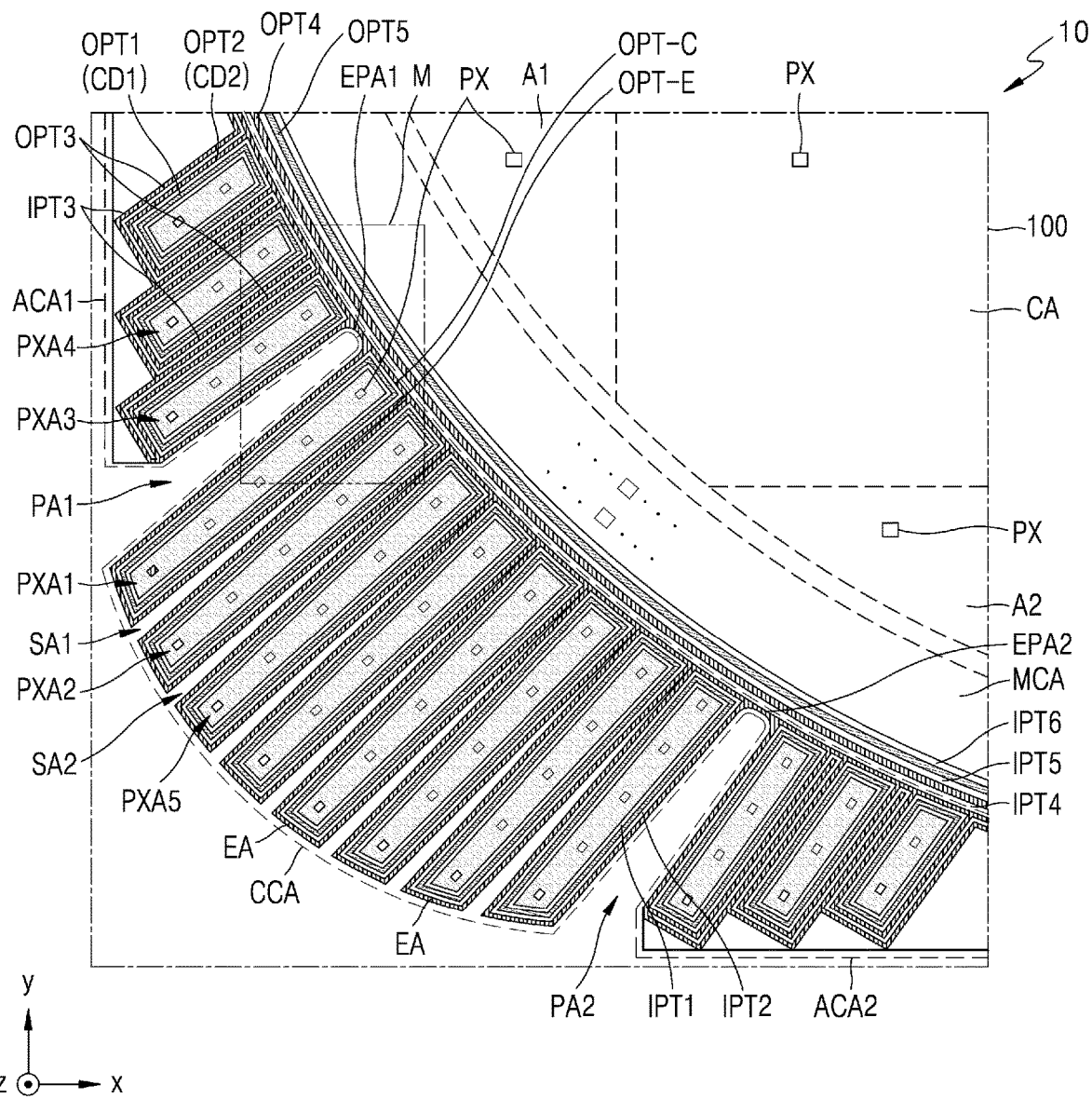
Figure 11B:
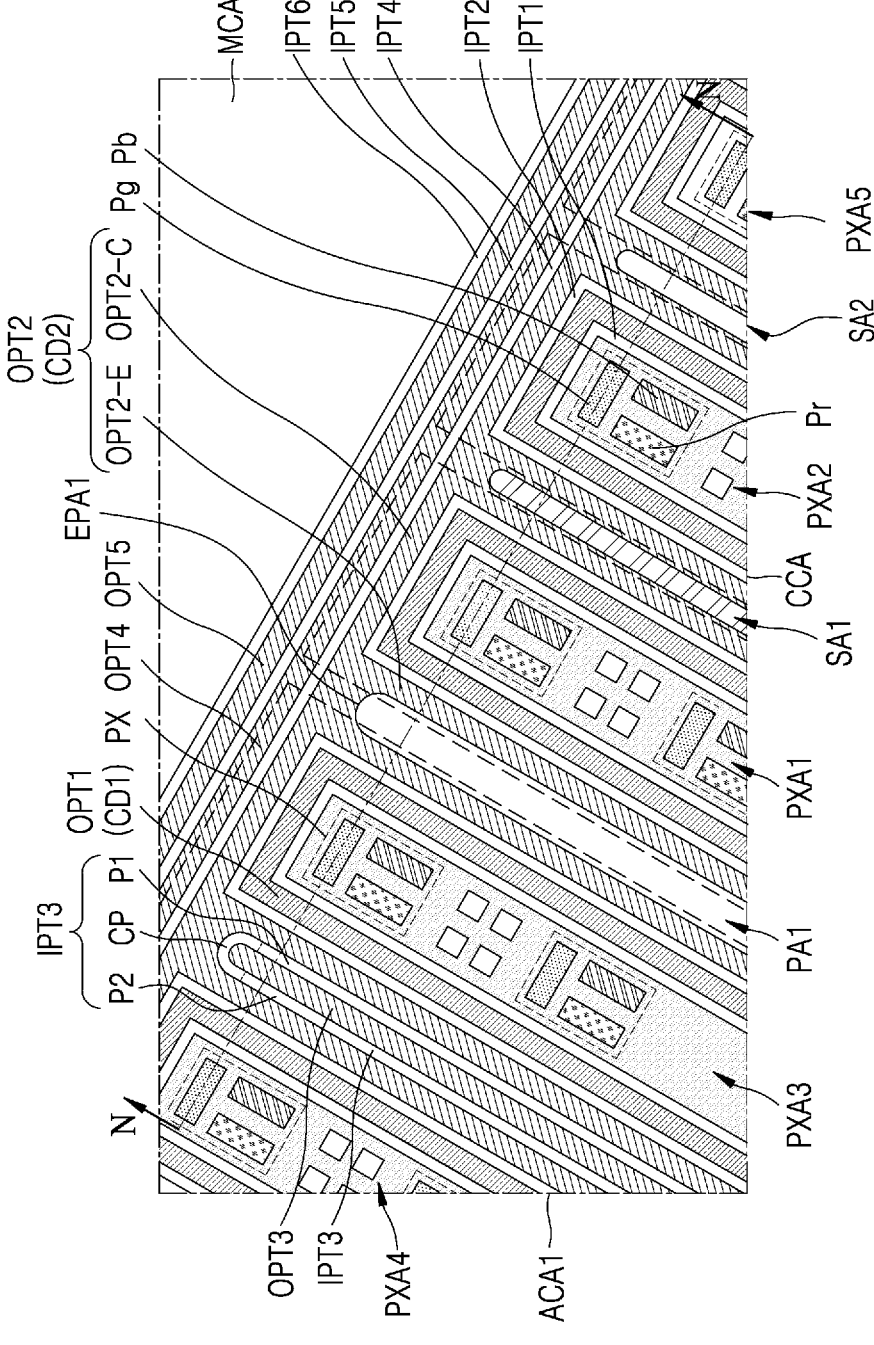
Figure 11C:
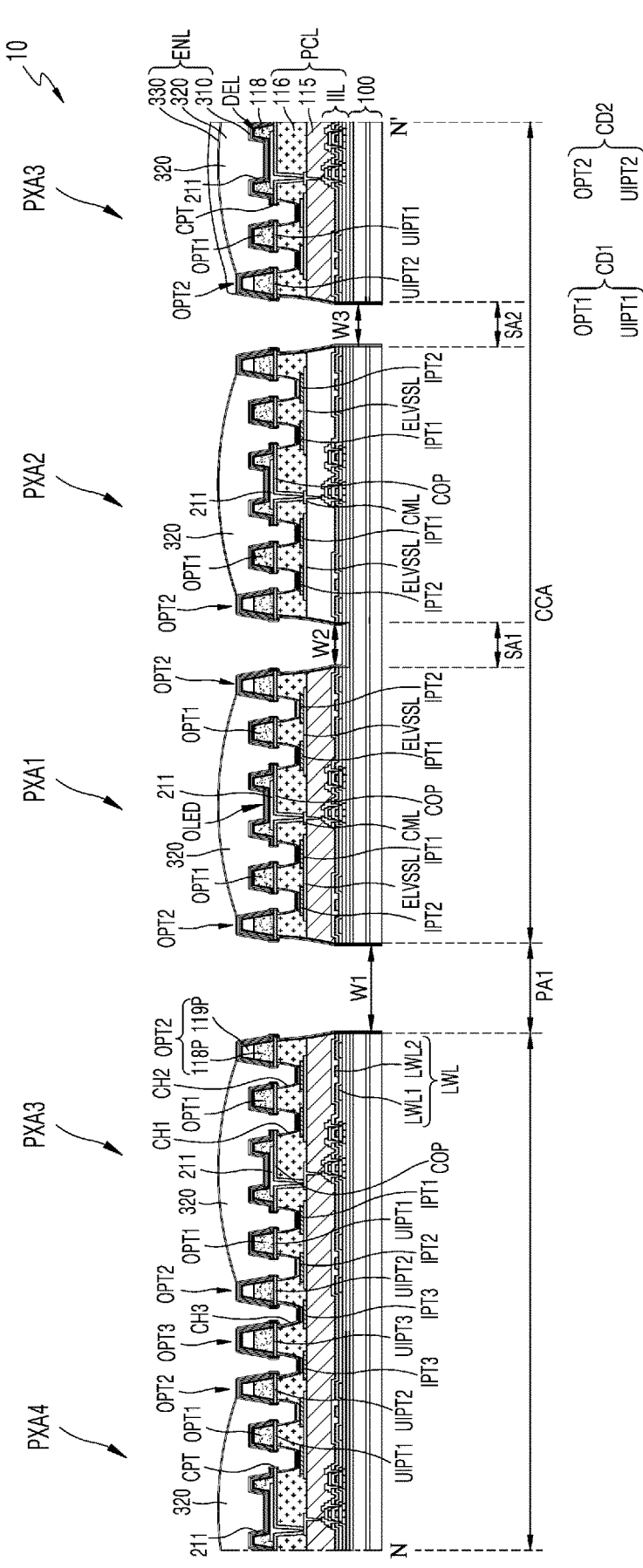

FIG. 6 is an enlarged view of an embodiment of region E of the display panel of FIG. 3;

FIG. 7 is an enlarged view of region F of the display panel of FIG. 6;

FIG. 8A is a schematic cross-sectional view of the display panel of FIG. 7, taken along line G-G';

FIG. 8B is an enlarged view of region H of the display panel of FIG. 8A;

FIG. 8C is an enlarged view of region I of the display panel of FIG. 8A;

FIG. 8D is an enlarged view of region J of the display panel of FIG. 8A;

FIG. 9A is a schematic cross-sectional view of another embodiment of the display panel of FIG. 7, taken along line G-G';

FIG. 9B is an enlarged view of region K of the display panel of FIG. 9A;

FIG. 10A is a schematic cross-sectional view of another embodiment of the display panel of FIG. 7, taken along line G-G';

FIG. 10B is an enlarged view of region L of the display panel of FIG. 10A;

FIG. 11A is an enlarged view of region E of another embodiment of the display panel of FIG. 3;

FIG. 11B is an enlarged view of region M of the display panel of FIG. 11A; and FIG. 11C is a schematic cross-sectional view of the display panel of FIG. 11B, taken along line N-N'.

DETAILED DESCRIPTION

Reference will now be made in detail to embodiments, embodiments of which are illustrated in the accompanying drawings, where like reference numerals refer to like elements throughout. In this regard, the illustrated embodiments may have different forms and should not be construed as being limited to the descriptions set forth herein. Accordingly, the embodiments are merely described below, by referring to the drawing figures, to explain features of the description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

While the disclosure is capable of various modifications and alternative forms, embodiments thereof are shown by way of example in the drawings and will herein be described in detail. Effects and characteristics of the disclosure, and realizing methods thereof will become apparent by referring to the drawings and embodiments described in detail below. However, the disclosure is not limited to the embodiments disclosed hereinafter and may be realized in various forms.

Hereinafter, the embodiments of will be described in detail with reference to the accompanying drawings. In the descriptions, like reference numerals refer to the like elements and the same descriptions will not be repeated.

It will be understood that the terms "first," "second," etc., may be used herein to describe various components, these components should not be limited by these terms. These components are only used to distinguish one component from another.

As used herein, the singular expressions "a," "an," and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or element is also referred to as being formed "on" another layer, area, or element, it may be directly or indirectly formed on the other layer, region, or element. That is, intervening layers, regions, or elements may be present, for example.

Sizes of elements in the drawings may be exaggerated for convenience of explanation. In an embodiment, sizes and thicknesses of the elements in the drawings are randomly indicated for convenience of explanation, for example, and thus, the disclosure is not necessarily limited to the illustrations of the drawings.

When an embodiment may be implemented differently, a predetermined process order may be performed differently from the described order. In an embodiment, two consecutively described processes may be performed substantially at the same time or performed in an order opposite to the described order.

In the embodiments hereinafter, it will be understood that when an element, an area, or a layer is also referred to as being connected to another element, area, or layer, it may be directly or indirectly connected to the other element, area, or layer. In an embodiment, it will be understood in this specification that when an element, an area, or a layer is also referred to as being in contact with or being electrically connected to another element, area, or layer, it may be directly or indirectly in contact with or electrically connected to the other element, area, or layer.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

A display apparatus may be an apparatus displaying a video or a static image and may be used as a display screen of various products including not only portable electronic devices, such as a mobile phone, a smartphone, a tablet personal computer, a mobile communication terminal, an electronic notebook, an electronic book, a portable multimedia player ("PMP"), a navigation device, and an ultramobile PC ("UMPC"), but also other devices, such as a television, a notebook computer, a monitor, a billboard, and an Internet of things ("IoT") device. Also, the display apparatus in an embodiment may be used in wearable devices, such as a smart watch, a watch phone, a glasses-type display, and a head-mounted display ("HMD"). Also, the display apparatus in an embodiment may be used as a gauge of a vehicle, a center fascia of a vehicle, or a center information display on a dashboard, a room mirror display substituting a side-view mirror of a vehicle, or a display disposed on a rear surface of a front seat, as an entertainment device for a backseat of a vehicle.

Figure 1:
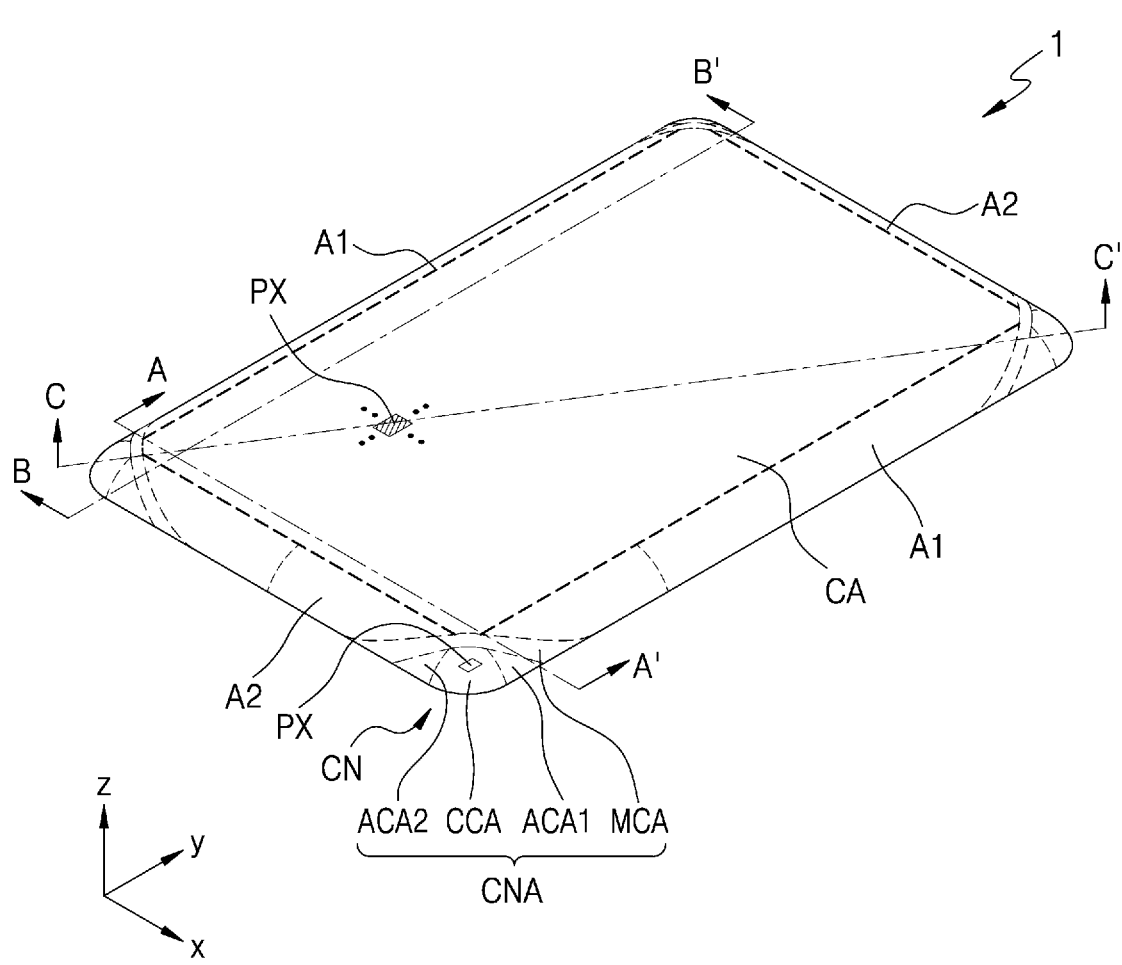
FIG. 1 is a schematic perspective view of an embodiment of a display apparatus.
Figure 2A:
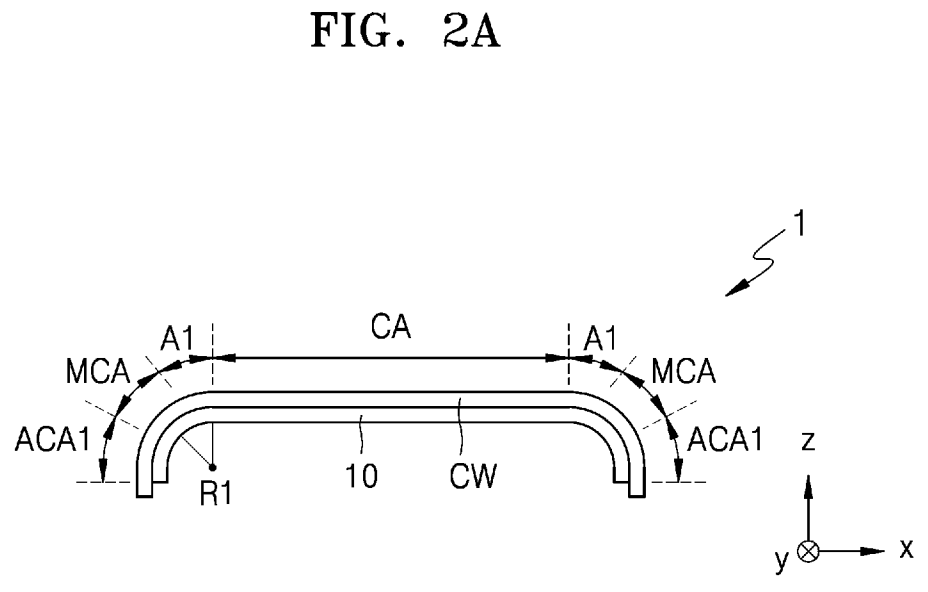
Figure 2B:
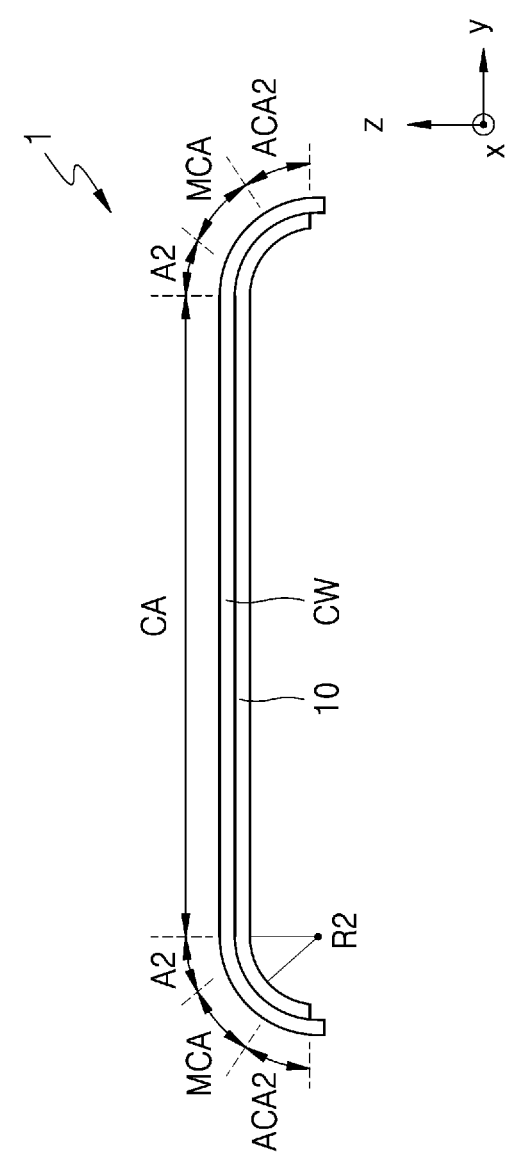
FIG. 2B is a cross-sectional view of the display apparatus of FIG. 1, taken along line B-B'.
Figure 2C:
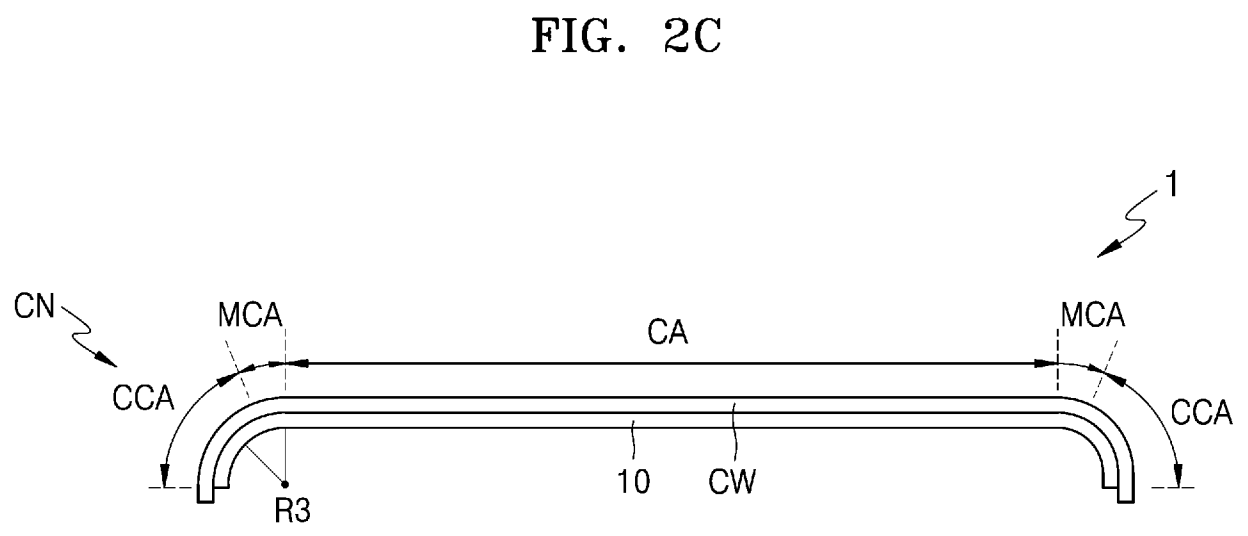

FIG. 1 is a schematic perspective view of an embodiment of a display apparatus 1, FIG. 2A is a cross-sectional view of the display apparatus 1 of FIG. 1, taken along line A-A', FIG. 2B is a cross-sectional view of the display apparatus 1 of FIG. 1, taken along line B-B', FIG. 2C is a cross-sectional view of the display apparatus 1 of FIG. 1, taken along line C-C', and FIG. 3 is a schematic plan view of a display panel 10 in a unbent state.

Referring to FIGS. 1, 2A to 2C, and 3, the display apparatus 1 may have an edge in a first direction and an edge in a second direction. Here, the first direction and the second direction may cross each other. In an embodiment, the first direction and the second direction may define an acute angle with each other, for example. In another embodiment, the first direction and the second direction may define an obtuse angle with each other or cross each other at right angles. Hereinafter, a case in which the first direction and the second direction cross each other at right angles is mainly described in detail. In an embodiment, the first direction may be an x direction or a –x direction (hereinafter, ±x), and the second direction may be a y direction or a –y direction (hereinafter, ±y), for example. In an embodiment, a corner CN at which the edge in the first direction ±x and the edge in the second direction ±y of the display apparatus 1 meet each other may have a predetermined curvature.

The display apparatus 1 may include the display panel 10 and a cover window CW covering the display panel 10.

The cover window CW may protect the display panel 10. The cover window CW may protect the display panel 10 by being easily bent according to an external force without cracks, etc., being generated. The cover window CW may include glass, sapphire, or plastic. In an embodiment, the cover window CW may include tempered glass or transparent polyimide and may have a structure in which a flexible polymer layer is arranged on a surface of a glass substrate or may include only a polymer layer, for example.

Although not shown, the display panel 10 may be bonded to the cover window CW by a transparent adhesive member, such as an optically clear adhesive film.

The display panel 10 may include a substrate 100 and a pixel PX arranged on the substrate 100. The pixel PX may be provided in a multiple number, and the plurality of pixels PX may emit light to display an image.

The pixel PX may include a display element. In an embodiment, the display element may include an organic light-emitting diode including an organic emission layer. In an alternative embodiment, the display element may include an inorganic light-emitting diode including an inorganic semiconductor. In an alternative embodiment, the display element may include a quantum dot light-emitting diode including a quantum dot emission layer. In an alternative embodiment, the display element may include a micro scale or nano scale light-emitting diode ("LED"). In an embodiment, the LED may include a micro-LED or a nanorod LED. The nanorod LED may include GaN. In an embodiment, a color conversion layer may be arranged on the nanorod LED, and the color conversion layer may include quantum dots.

The pixel PX may include a plurality of sub-pixels, and each of the plurality of sub-pixels may emit a predetermined color of light by the display element. In an embodiment, the pixel PX may include a red sub-pixel, a green sub-pixel, and a blue sub-pixel. In an alternative embodiment, the pixel PX may include a red sub-pixel, a green sub-pixel, a blue sub-pixel, and a white sub-pixel.

Referring to FIG. 3, the display panel 10 may display a central area CA, a first area A1, a second area A2, a corner area CNA, and a peripheral area PA. The first area A1, the second area A2, the corner area CNA, and the peripheral area PA of the display panel 10 illustrated in FIG. 3 may be bent to form the display apparatus 1 having a predetermined curvature at a corner, as illustrated in FIG. 1.

The pixel PX may be arranged in at least one of the central area CA, the first area A1, the second area A2, and the corner area CNA. In an embodiment, each of the plurality of pixels PX arranged in the central area CA, the first area A1, the second area A2, and the corner area CNA may provide a separate image. In another embodiment, each of the plurality of pixels PX arranged in the central area CA, the first area A1, the second area A2, and the corner area CNA may provide a portion of one image.

The central area CA may be flat. In an embodiment, the display apparatus 1 may provide most of the image on the central area CA.

The first area A1 may extend from the central area CA in the first direction ±x. The first area A1 may be connected to the central area CA in the first direction ±x. With respect to the central area CA, the first area A1 may be bent in a third direction ±z crossing the first direction ±x and the second direction ±y. The first area A1 may have a curved surface when viewed from a cross-section (an x-z cross-section) including the first direction ±x and the third direction ±z and may not have a curved surface when viewed from a cross-section (a y-z cross-section) including the second direction ±y and the third direction ±z.

FIG. 2A illustrates that the first areas A1 at opposite sides of the central area CA have the same curvature as each other. However, in another embodiment, the first areas A1 at opposite sides of the central area CA may have different curvatures from each other. In another embodiment, the first area A1 may be arranged at only one side of the central area CA.

The second area A2 may extend from the central area CA in the second direction ±y. The second area A2 may be connected to the central area CA in the second direction ±y. With respect to the central area CA, the second area A2 may be bent in the third direction ±z crossing the first direction ±x and the second direction ±y. The second area A2 may have a curved surface when viewed from the cross-section (the y-z cross-section) including the second direction ±y and the third direction ±z and may not have a curved surface when viewed from the cross-section (the x-z cross-section) including the first direction ±x and the third direction ±z.

FIG. 2B illustrates that the second areas A2 at opposite sides of the central area CA have the same curvature as each other. However, in another embodiment, the second areas A2 at opposite sides of the central area CA may have different curvatures from each other. In another embodiment, the second area A2 may be arranged at only one side of the central area CA.

The corner area CNA may be arranged at the corner CN of the display apparatus 1. In an embodiment, the corner area CNA may be an area at which the edge of the display apparatus 1 in the first direction ±x and the edge of the display apparatus 1 in the second direction ±y meet each other. The corner area CNA may at least partially surround the central area CA, the first area A1, and the second area A2.

The corner area CNA may include a central corner area CCA, a first adjacent corner area ACA1, a second adjacent corner area ACA2, and a middle corner area MCA.

With respect to the central area CA, the central corner area CCA may be bent in the third direction ±z crossing the first direction ±x and the second direction ±y. The central corner area CCA may include a curved surface when viewed from the cross-section (the x-z cross-section) including the first direction ±x and the third direction ±z and may include a curved surface when viewed from the cross-section (the y-z cross-section) including the second direction ±y and the third direction ±z. That is, the central corner area CCA may be a curved surface area in which curvatures in a plurality of directions overlap one another.

The first adjacent corner area ACA1 may be arranged to be adjacent to the central corner area CCA and may be arranged between the central corner area CCA and the first area A1. With respect to the central area CA, the first adjacent corner area ACA1 may be bent in the third direction ±z crossing the first direction ±x and the second direction ±y. The first adjacent corner area ACA1 may include a curved surface when viewed from the cross-section (the x-z cross-section) including the first direction ±x and the third direction ±z and may not have a curved surface when viewed from the cross-section (the y-z cross-section) including the second direction ±y and the third direction ±z.

The second adjacent corner area ACA2 may be arranged to be adjacent to the central corner area CCA and may be arranged between the central corner area CCA and the second area A2. The central corner area CCA may be arranged between the first adjacent corner area ACA1 and the second adjacent corner area ACA2. With respect to the central area CA, the second adjacent corner area ACA2 may be bent in the third direction ±z crossing the first direction ±x and the second direction ±y. The second adjacent corner area ACA2 may include a curved surface when viewed from the cross-section (the y-z cross-section) including the second direction ±y and the third direction ±z and may not have a curved surface when viewed from the cross-section (the x-z cross-section) including the first direction ±x and the third direction ±z.

The middle corner area MCA may be arranged between the central area CA and the central corner area CCA. The middle corner area MCA may extend between the first area A1 and the first adjacent corner area ACA1 and may extend between the second area A2 and the second adjacent corner area ACA2. A driving circuit DC which provides an electrical signal to the pixel PX and/or a power line which provides power to the pixel PX may be arranged in the middle corner area MCA.

Referring to FIG. 2A, the first area A1, the middle corner area MCA, and the first adjacent corner area ACA1 may bend by a first radius of curvature R1. Referring to FIG. 2B, the second area A2, the middle corner area MCA, and the second adjacent corner area ACA2 may bend by a second radius of curvature R2. The first radius of curvature R1 and the second radius of curvature R2 may be the same as or different from each other. Referring to FIG. 2C, the middle corner area MCA and the central corner area CCA may bend by a third radius of curvature R3.

In the display apparatus 1, the plurality of pixels PX may be arranged not only in the central area CA, but also in the first area A1, the second area A2, and the corner area CNA, for displaying an image. Accordingly, a display area of the display apparatus 1 may be expanded. Also, an image may be displayed on the corner CN of the display apparatus 1, and thus, an aesthetic sense may be improved.

The peripheral area PA may be an area, in which an image is not provided. The peripheral area PA may extend externally from the first area A1 and/or the second area A2. A driving circuit DC which provides an electrical signal to the pixels PX and/or a power line which provides power to the pixels PX may be arranged in the peripheral area PA.

Figure 4:
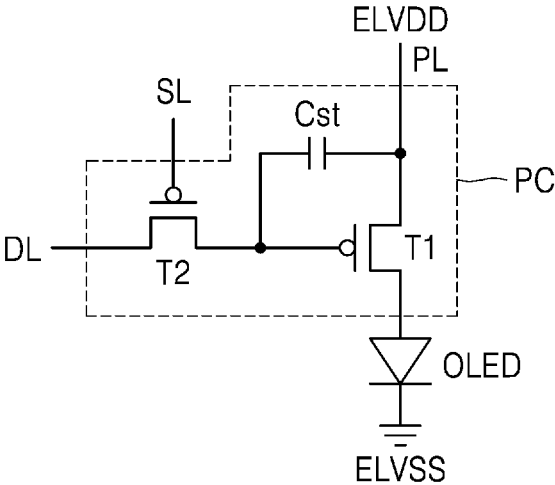
FIG. 4 is a schematic equivalent circuit diagram of a pixel circuit which may be applied to a display panel.

FIG. 4 is a schematic equivalent circuit diagram of a pixel circuit PC, which may be applied to the display panel 10.

Referring to FIG. 4, the pixel circuit PC may be electrically connected to a display element, e.g., an organic light-emitting diode OLED.

The pixel circuit PC may include a driving thin-film transistor T1, a switching thin-film transistor T2, and a storage capacitor Cst. In an embodiment, the organic light-emitting diode OLED may emit red, green, or blue light or red, green, blue, or white light.

The switching thin-film transistor T2 may be connected to a scan line SL and a data line DL and may transmit a data signal or a data voltage input through the data line DL, to the driving thin-film transistor T1, in response to a scan signal or a switching voltage input through the scan line SL. The storage capacitor Cst may be connected to the switching thin-film transistor T2 and a driving voltage line PL and may store a voltage corresponding to a difference between a voltage received from the switching thin-film transistor T2 and a first power voltage ELVDD supplied to the driving voltage line PL.

The driving thin-film transistor T1 may be connected to the driving voltage line PL and the storage capacitor Cst and may control a driving current flowing from the driving voltage line PL through the organic light-emitting diode OLED according to a value of the voltage stored in the storage capacitor Cst. The organic light-emitting diode OLED may emit light having a predetermined brightness according to the driving current. An opposite electrode of the organic light-emitting diode OLED may receive a second power voltage ELVSS.

FIG. 4 illustrates that the pixel circuit PC may include two thin-film transistors and one storage capacitor. However, the pixel circuit PC may include more thin-film transistors than the thin-film transistors illustrated in FIG. 4.

Figure 5:
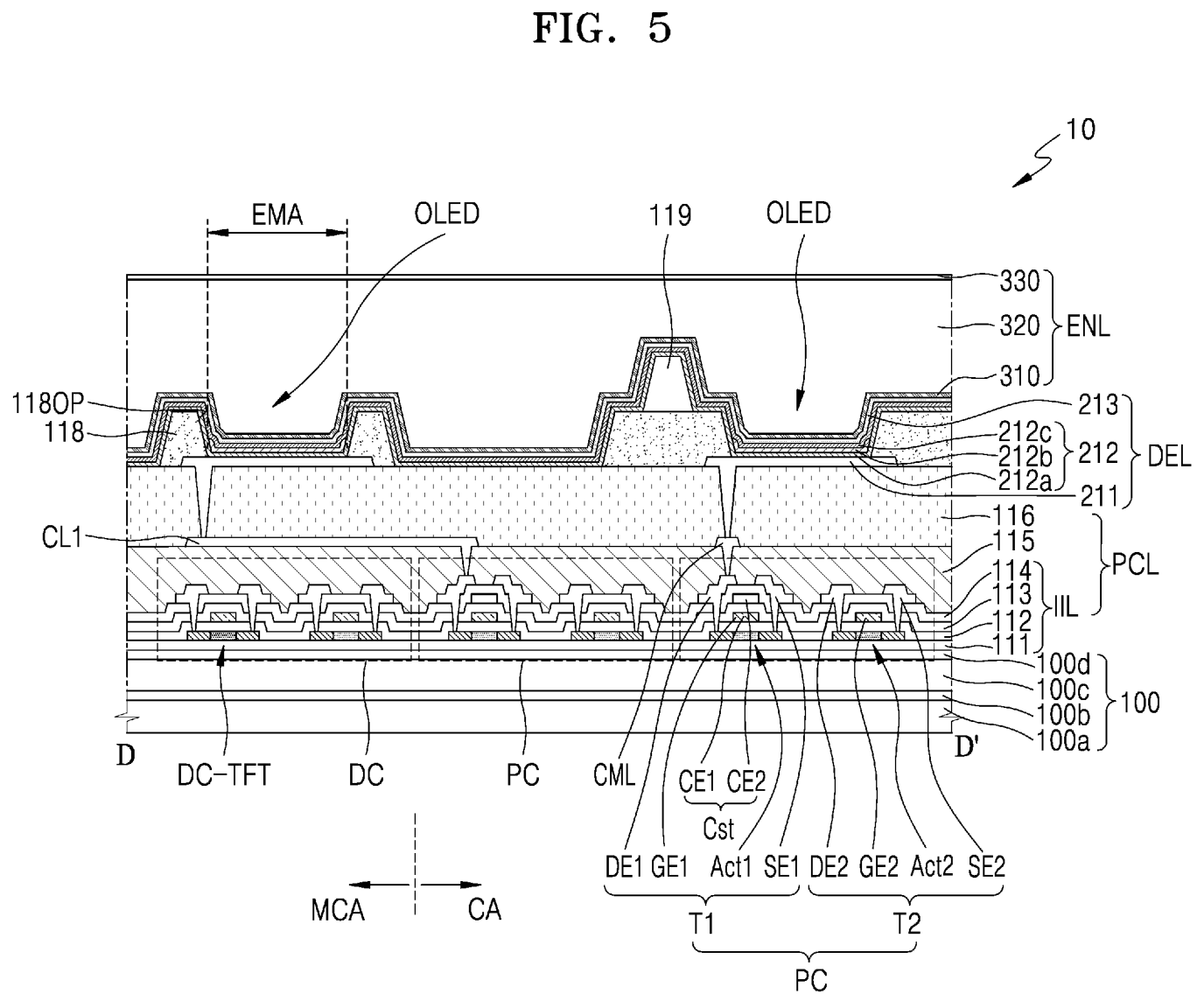

FIG. 5 is a schematic cross-sectional view of the display panel 10 of FIG. 3, taken along line D-D'. That is, FIG. 5 is a schematic cross-sectional view of the central area CA and the middle corner area MCA of the display panel 10.

Referring to FIG. 5, the display panel 10 may include the substrate 100, a pixel circuit layer PCL, a display element layer DEL, and an encapsulation layer ENL.

The substrate 100 may include a first base layer 100a, a first barrier layer 100b, a second base layer 100c, and a second barrier layer 100d. The first base layer 100a, the first barrier layer 100b, the second base layer 100c, and the second barrier layer 100d may be sequentially stacked. In another embodiment, the substrate 100 may include glass.

At least one of the first base layer 100a and the second base layer 100c may include polymer resins, such as polyethersulfone, polyarylate, polyetherimide, polyethylene naphthalate, polyethylene terephthalate, polyphenylene sulfide, polyimide, polycarbonate, cellulose tri acetate, or cellulose acetate propionate.

The first barrier layer 100b and the second barrier layer 100d may prevent the penetration of external impurities and may include a single layer or multiple layers including an inorganic material, such as silicon nitride (SiN$_x$), silicon oxide (SiO$_2$), and/or silicon oxynitride (SiON).

The pixel circuit layer PCL may be arranged on the substrate 100. The pixel circuit layer PCL may include a driving circuit DC and a pixel circuit PC.

In an embodiment, the driving circuit DC may be arranged in the middle corner area MCA. In another embodiment, the driving circuit DC may not be arranged in the middle corner area MCA. In this case, the driving circuit DC may be arranged in the peripheral area PA.

The pixel circuit PC may be arranged in the central area CA. In an embodiment, the pixel circuit PC may be arranged to be apart from the middle corner area MCA. In other words, the pixel circuit PC may not overlap the middle corner area MCA. In another embodiment, the pixel circuit PC may overlap the middle corner area MCA.

The driving circuit DC may include a scan driving circuit which provides a scan signal to each pixel PX through a scan line SL or a data driving circuit which provides a data signal to each pixel PX through a data line DL. The driving circuit DC may include a driving circuit thin-film transistor DC-TFT. In an embodiment, the driving circuit DC may be connected to the scan line SL.

The pixel circuit PC may include at least one thin-film transistor. In an embodiment, the pixel circuit PC may include the driving thin-film transistor T1, the switching thin-film transistor T2, and the storage capacitor Cst.

The pixel circuit layer PCL may further include an inorganic insulating layer IIL, a first organic insulating layer 115, and a second organic insulating layer 116 arranged below or/and above components of the driving thin-film transistor T1.

The inorganic insulating layer IIL may include a buffer layer 111, a first gate insulating layer 112, a second gate insulating layer 113, and an inter-insulating layer 114. The driving thin-film transistor T1 may include a first semiconductor layer Act1, a first gate electrode GE1, a first source electrode SE1, and a first drain electrode DE1.

The buffer layer 111 may be arranged on the substrate 100. The buffer layer 111 may include an inorganic insulating material, such as $SiN_x$, SiON, and $SiO_2$, and may include a single layer or multiple layers including the inorganic insulating materials described above.

The first semiconductor layer Act1 may be arranged on the buffer layer 111. The first semiconductor layer Act1 may include polysilicon. In an alternative embodiment, the first semiconductor layer Act1 may include amorphous silicon, an oxide semiconductor, or an organic semiconductor. The first semiconductor layer Act1 may include a channel area, a drain area and a source area arranged at opposite sides of the channel area, respectively.

The first gate electrode GE1 may overlap the channel area. The first gate electrode GE1 may include a low-resistance metal material. The first gate electrode GE1 may include a conductive material including Mo, Al, Cu, Ti, etc., and may include multiple layers or a single layer including the conductive materials described above.

The first gate insulating layer 112 between the first semiconductor layer Act1 and the first gate electrode GE1 may include an inorganic insulating material, such as $SiO_2$, $SiN_x$, SiON, aluminum oxide ($Al_2O_3$), titanium oxide ($TiO_2$), tantalum oxide ($Ta_2O_5$), hafnium oxide ($HfO_2$), and/or zinc oxide (ZnO).

The second gate insulating layer 113 may cover the first gate electrode GE1. The second gate insulating layer 113 may include an inorganic insulating material, such as $SiO_2$, $SiN_x$, SiON, $Al_2O_3$, $TiO_2$, $Ta_2O_5$, $HfO_2$, and/or ZnO, similarly with the first gate insulating layer 112.

An upper electrode CE2 of the storage capacitor Cst may be arranged above the second gate insulating layer 113. The upper electrode CE2 may overlap the first gate electrode GE1. The first gate electrode GE1 of the driving thin-film transistor T1 and the upper electrode CE2 may overlap each other with the second gate insulating layer 113 therebetween to form the storage capacitor Cst. That is, the first gate electrode GE1 of the driving thin-film transistor T1 may also serve as a lower electrode CE1 of the storage capacitor Cst. In another embodiment, the storage capacitor Cst may be formed not to overlap the driving thin-film transistor T1.

The upper electrode CE2 may include Al, Pt, Pd, Ag, Mg, Au, Ni, Nd, Ir, Cr, Ca, Mo, Ti, W, and/or Cu and may include a single layer or layers including the materials described above.

The inter-insulating layer 114 may cover the upper electrode CE2. The inter-insulating layer 114 may include $SiO_2$, $SiN_x$, SiON, $Al_2O_3$, $TiO_2$, $Ta_2O_5$, $HfO_2$, ZnO, or the like. The inter-insulating layer 114 may include a single layer or layers including the inorganic insulating materials described above.

Each of the first drain electrode DE1 and the first source electrode SE1 may be arranged on the inter-insulating layer 114. The first drain electrode DE1 and the first source electrode SE1 may include a highly conductive material. The first drain electrode DE1 and the first source electrode SE1 may include a conductive material including Mo, Al, Cu, Ti, etc., and may include multiple layers or a single layer including the materials described above. In an embodiment, the first drain electrode DE1 and the first source electrode SE1 may have a multi-layered structure of Ti/Al/Ti.

The switching thin-film transistor T2 may include a second semiconductor layer Act2, a second gate electrode GE2, a second drain electrode DE2, and a second source electrode SE2. The second semiconductor layer Act2, the second gate electrode GE2, the second drain electrode DE2, and the second source electrode SE2 may respectively be substantially the same as the first semiconductor layer Act1, the first gate electrode GE1, the first drain electrode DE1, and the first source electrode SE1, and thus, their detailed descriptions are omitted.

Similarly with the switching thin-film transistor T2, the driving circuit thin-film transistor DC-TFT may include a driving circuit semiconductor layer, a driving circuit gate electrode, a driving circuit source electrode, and a driving circuit drain electrode.

The first organic insulating layer 115 may be arranged on at least one thin-film transistor. In an embodiment, the first organic insulating layer 115 may be arranged to cover the first drain electrode DE1 and the first source electrode SE1. The first organic insulating layer 115 may include an organic material. In an embodiment, the first organic insulating layer 115 may include an organic insulating material, such as a general-purpose polymer such as polymethylmethacrylate ("PMMA") or polystyrene ("PS"), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or any combinations thereof, for example.

A connection electrode CML and a first connection line CL1 may be arranged on the first organic insulating layer 115. The connection electrode CML and the first connection line CL1 may include a highly conductive material. The connection electrode CML and the first connection line CL1 may include a conductive material including Mo, Al, Cu, Ti, etc., and may include multiple layers or a single layer including the materials described above. In an embodiment, the connection electrode CML and the first connection line CL1 may have a multi-layered structure of Ti/Al/Ti. Here, the connection electrode CML may be connected to the first drain electrode DE1 or the first source electrode SE1 of the pixel circuit PC through a contact hole of the first organic insulating layer 115.

As illustrated in FIG. 5, the first connection line CL1 may extend from the central area CA to the middle corner area MCA. In another embodiment, the first connection line CL1 may extend from the peripheral area PA (FIG. 3) or the corner area CNA (FIG. 3) to the middle corner area MCA. In another embodiment, the first connection line CL1 may extend from the first area A1 (FIG. 3) and/or the second area A2 (FIG. 3) to the middle corner area MCA. The first connection line CL1 may overlap the driving circuit thin-film transistor DC-TFT. Here, the first connection line CL1 may be connected, through the contact hole of the first organic insulating layer 115, to the first drain electrode DE1 or the first source electrode SE1 of the pixel circuit PC in the central area CA.

The second organic insulating layer 116 may be arranged on the first organic insulating layer 115 to cover the connection electrode CML and the first connection line CL1. The second organic insulating layer 116 may include an organic material. The second organic insulating layer 116 may include an organic insulating material, such as a general-purpose polymer such as PMMA or PS, a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or any combinations thereof.

The display element layer DEL may be arranged on the pixel circuit layer PCL. The display element layer DEL may include a plurality of organic light-emitting diodes OLED, as display elements.

In an embodiment, any one of the plurality of organic light-emitting diodes OLED may be arranged in the central area CA. The organic light-emitting diode OLED arranged in the central area CA may be electrically connected to the connection electrode CML, through a contact hole of the second organic insulating layer 116.

Another one of the plurality of organic light-emitting diodes OLED may be arranged in the middle corner area MCA. The organic light-emitting diode OLED arranged in the middle corner area MCA may overlap the driving circuit DC, and the organic light-emitting diode OLED arranged in the middle corner area MCA may be electrically connected to the first connection line CL1, through the contact hole of the second organic insulating layer 116. Here, the first connection line CL1 may be connected, through the contact hole of the first organic insulating layer 115, to the first drain electrode DE1 or the first source electrode SE1 of the pixel circuit PC in the central area CA. Thus, the display panel 10 may also display an image in the middle corner area MCA, in which the driving circuit DC may be arranged.

The organic light-emitting diode OLED may include a pixel electrode 211, an intermediate layer 212, and an opposite electrode 213.

The pixel electrode 211 may be electrically connected to the connection electrode CML or the first connection line CL1 through the contact hole of the second organic insulating layer 116. The pixel electrode 211 may include conductive oxide, such as indium tin oxide ("ITO"), indium zinc oxide ("IZO"), ZnO, indium oxide (In₂O₃), indium gallium oxide ("IGO"), or aluminum zinc oxide ("AZO"). In another embodiment, the pixel electrode 211 may include a reflective layer including Ag, Mg, Al, Pt, Pd, Au, Ni, Nd, Ir, Cr, or any combinations thereof. In another embodiment, the pixel electrode 211 may further include a layer including ITO, IZO, ZnO, or In₂O₃ above/below the reflective layer described above.

A pixel-defining layer 118 in which an opening 1180P exposing a central portion of the pixel electrode 211 is defined may be arranged on the pixel electrode 211. The pixel-defining layer 118 may include an organic insulating material and/or an inorganic insulating material. The opening 1180P may define an emission area (hereinafter, also referred to as an emission area EMA) of light emitted from the organic light-emitting diode OLED. In an embodiment, a width of the opening 1180P may correspond to a width of the emission area EMA, for example. Also, a width of the opening 1180P may correspond to a width of a sub-pixel.

A spacer 119 may be arranged on the pixel-defining layer 118. When a deposition material is deposited by a mask sheet in which a plurality of pattern holes is defined, defects may occur, e.g., a portion of one or more layers formed on the substrate 100 may be damaged or fractured due to the mask sheet. The spacer 119 may prevent the damage to the layer caused by the mask sheet.

The spacer 119 may include an organic insulating material, such as polyimide. In an alternative embodiment, the spacer 119 may include an inorganic insulating material, such as SiNₓ or SiO₂, or may include both of an organic insulating material and an inorganic insulating material.

In an embodiment, the spacer 119 may include a different material from that of the pixel-defining layer 118. In an alternative embodiment, the spacer 119 may include the same material as that of the pixel-defining layer 118, and in this case, the pixel-defining layer 118 and the spacer 119 may be formed together by a half-tone mask.

The intermediate layer 212 may be arranged on the pixel-defining layer 118. The intermediate layer 212 may include an emission layer 212b arranged in the opening 1180P of the pixel-defining layer 118. The emission layer 212b may include a high molecular-weight or low molecular-weight organic material emitting a predetermined color of light.

A first functional layer 212a and a second functional layer 212c may be arranged above and below the emission layer 212b, respectively. The first functional layer 212a may include, e.g., a hole transport layer, or a hole transport layer and a hole injection layer. The second functional layer 212c may be arranged above the emission layer 212b and may be optionally arranged. The second functional layer 212c may include an electron transport layer and/or an electron injection layer. The first functional layer 212a and/or the second functional layer 212c may be (a) common layer(s) commonly covering the plurality of pixels PX as the opposite electrode 213 to be described below.

The opposite electrode 213 may be arranged on the intermediate layer 212. The opposite electrode 213 may include a conductive material having a low work function. In an embodiment, the opposite electrode 213 may include a (semi) transparent layer including Ag, Mg, Al, Pt, Pd, Au, Ni, Nd, Ir, Cr, Li, Ca, or any alloys thereof, for example. In an alternative embodiment, the opposite electrode 213 may further include a layer including ITO, IZO, ZnO, or In₂O₃ on the (semi) transparent layer including the materials described above.

In some embodiments, a capping layer (not shown) may further be arranged on the opposite electrode 213. The capping layer may include LiF, an inorganic material, or/and an organic material.

The encapsulation layer ENL may be arranged on the opposite electrode 213. In an embodiment, the encapsulation layer ENL may include at least one inorganic encapsulation layer and at least one organic encapsulation layer. In an embodiment, FIG. 5 illustrates that the encapsulation layer ENL may include a first inorganic encapsulation layer 310, an organic encapsulation layer 320, and a second inorganic encapsulation layer 330 that are sequentially stacked.

The first inorganic encapsulation layer 310 and the second inorganic encapsulation layer 330 may include one or more inorganic materials from among Al₂O₃, TiO₂, Ta₂O₅, HfO₂, ZnO, SiO₂, SiNₓ, and SiON. The organic encapsulation layer 320 may include a polymer-based material. The polymer-based material may include acryl-based resins, epoxybased resins, polyimide, polyethylene, etc. In an embodiment, the organic encapsulation layer 320 may include acrylate.

The first inorganic encapsulation layer 310, the organic encapsulation layer 320, and the second inorganic encapsulation layer 330 arranged in the central area CA and the middle corner area MCA may be continually and commonly arranged in the plurality of pixels PX in the central area CA and the middle corner area MCA.

Although not shown, a touch electrode layer may be arranged on the encapsulation layer ENL, and an optical functional layer may be arranged on the touch electrode layer. The touch electrode layer may obtain coordinate information based on an external input, e.g., a touch event. The optical functional layer may reduce a reflectivity of light (external light) incident toward a display apparatus from the outside and/or may improve a color purity of light emitted from the display apparatus.

In an embodiment, the optical functional layer may include a phase retarder and a polarizer. The phase retarder may include a film-type phase retarder or a liquid crystal coating-type phase retarder, and may include a $\lambda/2$ phase retarder and/or a $\lambda/4$ phase retarder. The polarizer may also include a film-type polarizer or a liquid crystal coating-type polarizer. The film-type polarizer may include an elongation-type synthetic resin film, and the liquid crystal coating-type polarizer may include liquid crystals arranged in a predetermined shape. The phase retarder and the polarizer may further include a protective film.

In another embodiment, the optical functional layer may include a black matrix and color filters. The color filters may be arranged based on a color of light emitted from each of pixels of the display apparatus. Each of the color filters may include a red, green, or blue pigment or dye. In an alternative embodiment, each of the color filters may further include quantum dots, in addition to the pigment or the dye described above. In an alternative embodiment, some of the color filters may not include the pigment or the dye described above and may include scattered particles, such as oxide titanium.

In another embodiment, the optical functional layer may include a destructive interference structure. The destructive interference structure may include a first reflective layer and a second reflective layer arranged on different layers from each other. First reflective light and second reflective light reflected from the first reflective layer and the second reflective layer, respectively, may destructively interfere, and thus, the reflectivity of external light may be decreased.

An adhesive member may be arranged between the touch electrode layer and the optical functional layer. The adhesive member may not be limited to particular types and may be implemented as general members known in the art. In an embodiment, the adhesive member may include a pressure sensitive adhesive ("PSA").

FIG. 6 is an enlarged view of region E of the display panel 10 of FIG. 3, in an embodiment, and FIG. 7 is an enlarged view of region F of the display panel 10 of FIG. 6.

Referring to FIGS. 6 and 7, the central corner area CCA may be arranged between the first adjacent corner area ACA1 and the second adjacent corner area ACA2.

The central corner area CCA may include a plurality of extension areas EA extending in a direction away from the central area CA. Ends of the extension areas EA adjacent to each other may be spaced apart from each other by a spaced area SA. The spaced area SA may be an area, in which components of the display panel 10 are not arranged, except for the substrate 100.

When the central corner area CCA bends at the corner CN, a compressive strain which may occur in the central corner area CCA may be greater than a tensile strain which may occur in the central corner area CCA. However, the ends of the plurality of extension areas EA adjacent to each other may be spaced apart from each other by the spaced area SA, and thus, damage to the central corner area CCA may be minimized when the display panel 10 bends.

The first adjacent corner area ACA1 may be adjacent to a side of the central corner area CCA, and the second adjacent corner area ACA2 may be adjacent to the other side of the central corner area CCA. The central corner area CCA and the first adjacent corner area ACA1 may be spaced apart from each other by a first penetration area PA1, and the central corner area CCA and the second adjacent corner area ACA2 may be spaced apart from each other by a second penetration area PA2. The first penetration area PA1 and the second penetration area PA2 may be empty areas of the display panel 10. That is, the first penetration area PA1 and the second penetration area PA2 may be areas in which the components of the display panel 10 (e.g., the substrate 100 of the display panel 10) are not arranged.

When the central corner area CCA bends at the corner CN, the central corner area CCA may be more greatly affected by the compressive strain than the tensile strain. Particularly, a greater compressive strain may occur at both edges of the central corner area CCA than between the extension areas EA arranged in the central corner area CCA. However, the components of the display panel 10 (e.g., the substrate 100 of the display panel 10) may not be arranged in the first penetration area PA1 and the second penetration area PA2, and thus, damage to the display panel 10 caused by the compressive strain may be minimized.

Also, a width W1 (FIG. 8A) of each of the first and second penetration areas PA1 and PA2 may be greater than a width W2 (FIG. 8A) of the spaced area SA, and thus, damage to the display panel 10 at both edges of the central corner area CCA caused by the compressive strain may be minimized. Here, the width W1 of the first and second penetration areas PA1 and PA2 may be a distance between the substrate 100, by which the first and second adjacent corner areas ACA1 and ACA2 are apart from the central corner area CCA on the substrate 100, in a cross-sectional view. The substrate 100 may be connected in the spaced area SA, and thus, the width W2 of the spaced area SA may be a distance between non-connected components directly above the substrate 100. In an embodiment, referring to FIG. 8A, the width W2 may be a distance between the inorganic insulating layer IIL, which is a non-connected component directly above the substrate 100, for example. Each of the widths W1 and W2 may vary between an area relatively adjacent to the central area CA and an area relatively far from the central area CA in a plan view. In this case, the widths W1 and W2 may be compared with each other, based on a position apart from the central area CA by the same distance, for example. FIG. 8A illustrates the first inorganic encapsulation layer 310 and the second inorganic encapsulation layer 330 of the encapsulation layer ENL together. However, when each width W1 or W2 is measured, the first inorganic encapsulation layer 310 and the second inorganic encapsulation layer 330 may be ignored, because their thicknesses are substantially small.

By increasing the width W1 of each of the first penetration area PA1 and the second penetration area PA2, a space may be obtained at an inner side of each of the first and second penetration areas PA1 and PA2, that is, an area EPA1 or EPA2 adjacent to the central area CA. Thus, the area EPA1 or EPA2 may be formed to have a serpentine shape, for example. It is illustrated in FIG. 6 that the areas EPA1 and EPA2 may have a round shape. However, the areas EPA1 and EPA2 are not limited thereto. The areas EPA1 and EPA2 may be formed to be winding or concavo-convex, and thus, stress concentration at the areas EPA1 and EPA2 may be alleviated in order to prevent cracks.

The plurality of pixels PX including display elements may be arranged in the central area CA, the first area A1, the second area A2, and the corner area CNA. In an embodiment, the plurality of pixels PX arranged in the extension area EA which is most adjacent to the first adjacent corner area ACA1, from among the plurality of extension areas EA arranged in the central corner area CCA, may form a first pixel array PXA1, and the plurality of pixels PX arranged in the extension area EA most adjacent to the first pixel array PXA1 may form a second pixel array PXA2, for example. The plurality of pixels PX arranged in the first adjacent corner area ACA1 which is most adjacent to the first pixel array PXA1 may form a third pixel array PXA3, and the plurality of pixels PX arranged in the first adjacent corner area ACA1 which is most adjacent to the third pixel array PXA3 may form a fourth pixel array PXA4.

For convenience, the first and second pixel arrays PXA1 and PXA2 in the central corner area CCA and the third and fourth pixel arrays PXA3 and PXA4 in the first adjacent corner area ACA1 are mainly described. However, features of the first and second pixel arrays PXA1 and PXA2 may be likewise applied to other pixel arrays in the central corner area CCA, and features of the third and fourth pixel arrays PXA3 and PXA4 may be likewise applied to other pixel arrays in the first adjacent corner area ACA1 and the second adjacent corner area ACA2, hereinafter.

The plurality of pixels PX arranged in the first to fourth pixel arrays PXA1 to PXA4 may be arranged in a direction away from the central area CA and/or the first area A1. FIG. 7 illustrates that each pixel PX may include a red sub-pixel Pr, a green sub-pixel Pg, and a blue sub-pixel Pb, and the green sub-pixel Pg may be arranged in a first column, and the red sub-pixel Pr and the blue sub-pixel Pb may be arranged in a second column, in an embodiment. However, types and arrangements of the sub-pixels Pr, Pg, and Pb are not limited thereto.

FIGS. 6 and 7 are plan views illustrating a state where the display element layer DEL and the encapsulation layer ENL illustrated in FIG. 8A are not included and schematically illustrating an arrangement relationship between the first to fourth pixel arrays PXA1 to PXA4 and a plurality of organic patterns and a plurality of inorganic patterns. Referring to FIGS. 6 and 7, in a plan view, the first to fourth pixel arrays PXA1 to PXA4 may be surrounded by the plurality of organic patterns and the plurality of inorganic patterns.

Each of the first to fourth pixel arrays PXA1 to PXA4 may be surrounded by a first organic pattern OPT1 and a second organic pattern OPT2. Each of the first organic pattern OPT1 and the second organic pattern OPT2 may include a layer including an organic insulating material. The first organic pattern OPT1 may surround each of the first to fourth pixel arrays PXA1 to PXA4, and the second organic pattern OPT2 may surround the first organic pattern OPT1. The first organic pattern OPT1 and the second organic pattern OPT2 may include an organic insulating layer included in each of a first corner dam CD1 (FIG. 8A) and a second corner dam CD2 (FIG. 8B) to be described below.

Each of the first to fourth pixel arrays PXA1 to PXA4 may be surrounded by the first organic pattern OPT1 having a closed-loop shape, and the first organic patterns OPT1 respectively surrounding the first to fourth pixel arrays PXA1 to PXA4 may be apart from each other in a plan view.

The first organic pattern OPT1 arranged in each of the first to fourth pixel arrays PXA1 to PXA4 may be surrounded by the second organic pattern OPT2, and the first organic pattern OPT1 and the second organic pattern OPT2 surrounding each of the first to fourth pixel arrays PXA1 to PXA4 may be apart from each other in a plan view.

While the first organic patterns OPT1 respectively surrounding the first to fourth pixel arrays PXA1 to PXA4 are apart from each other, the second organic patterns OPT2 respectively surrounding the first to fourth pixel arrays PXA1 to PXA4 may be connected to each other at a side adjacent to the middle corner area MCA, and the connected second organic patterns OPT2 may be arranged to surround the middle corner area MCA.

As described above, the second organic pattern OPT2 may include a connection portion OPT2-C surrounding the middle corner area MCA and an extension portion OPT2-E extending from the connection portion OPT2-C. The extension portion OPT2-E of the second organic pattern OPT2 may surround the first organic pattern OPT1 of each of the first to fourth pixel arrays PXA1 to PXA4.

A shape of the extension portion OPT2-E of the second organic pattern OPT2 may be similar to a shape of each of the first to fourth pixel arrays PXA1 to PXA4, and particularly, may approximately correspond to each of the extension areas EA of the central corner area CCA. Thus, a feature that the extension areas EA of the central corner area CCA are spaced apart from each other by the spaced area SA may be interpreted to be the same as a feature that the extension portions OPT2-E of the second organic patterns OPT2 respectively surrounding the pixel arrays arranged in the central corner area CCA are spaced apart from each other by the spaced area SA. In an embodiment, the components of the display panel 10, except for the substrate 100, may not be arranged between the extension portions OPT2-E of the second organic patterns OPT2 surrounding the first pixel array PXA1 and the second pixel array PXA2, for example.

A third organic pattern OPT3 may be arranged between the extension portions OPT2-E of the second organic patterns OPT2 surrounding the third pixel array PXA3 and the fourth pixel array PXA4. The third organic patterns OPT3 may be arranged between the extension portions OPT2-E of the second organic patterns OPT2 of the pixel arrays arranged in the first and second adjacent corner areas ACA1 and ACA2 and may be connected to each other while surrounding the extension portions OPT2-E of the second organic patterns OPT2. Thus, there may be no spaced area SA between the extension portions OPT2-E of the second organic patterns OPT2 surrounding the pixel arrays arranged in the first and second adjacent corner areas ACA1 and ACA2.

The first organic pattern OPT1 and the second organic pattern OPT2 may serve to limit the organic encapsulation layer 320 (FIG. 8A) formed in the first to fourth pixel arrays PXA1 to PXA4 not to exceed the second organic pattern OPT2. Thus, the organic encapsulation layer 320 (FIG. 8A) formed in the first to fourth pixel arrays PXA1 to PXA4 may be separately formed for each of the first to fourth pixel arrays PXA1 to PXA4. In addition, all of the entirety of the organic encapsulation layers 320 (FIG. 8A) formed in the central corner area CCA, the first adjacent corner area ACA1, and the second adjacent corner area ACA2 may be separately formed for each pixel array. This feature differs from the feature described with reference to FIG. 5, in which the organic encapsulation layer 320 formed in the plurality of pixels PX of the central area CA and the middle corner area MCA may be continually and commonly formed in the plurality of pixels PX in the central area CA and the middle corner area MCA.

Although FIG. 5 does not illustrate a structure of the pixels PX arranged in the first area A1 and the second area A2, the structure of the pixels PX in the first area A1 and the second area A2 may be the same as the structure of the pixels PX in the central area CA. Thus, the organic encapsulation layer 320 may be continually and commonly formed in the plurality of pixels PX arranged in the central area CA, the first area A1, the second area A2, and the middle corner area MCA, but the organic encapsulation layer 320 may be separately formed for each pixel array in the central corner area CCA and the first and second adjacent corner areas ACA1 and ACA2.

A fourth organic pattern OPT4 surrounding the middle corner area MCA may further be arranged between the connection portion OPT2-C of the second organic pattern OPT2 and the middle corner area MCA, and a fifth organic pattern OPT5 apart from the fourth organic pattern OPT4 and surrounding the middle corner area MCA may further be arranged between the fourth organic pattern OPT4 and the middle corner area MCA. The fourth organic pattern OPT4 and the fifth organic pattern OPT5 may include the same material as each other and may serve to limit the organic encapsulation layer 320 commonly formed in the plurality of pixels PX arranged in the central area CA, the first area A1, the second area A2, and the middle corner area MCA not to exceed the central corner area CCA and the first and second adjacent corner areas ACA1 and ACA2.

A first inorganic pattern IPT1 may be arranged between the first pixel array PXA1 and the first organic pattern OPT1 to surround the first pixel array PXA1, and a second inorganic pattern IPT2 may be arranged between the first organic pattern OPT1 and the second organic pattern OPT2 to surround the first organic pattern OPT1. The first inorganic pattern IPT1 and the second inorganic pattern IPT2 may be likewise applied to the pixel arrays arranged in the central corner area CCA and the first and second adjacent corner areas ACA1 and ACA2, in addition to the first to fourth pixel arrays PXA1 to PXA4.

The first inorganic pattern IPT1 may surround each of the first to fourth pixel arrays PXA1 to PXA4 in a closed-loop shape, and each of the first inorganic patterns IPT1 may be separate from each other in a plan view. The second inorganic pattern IPT2 may surround the first organic pattern OPT1 of each of the first to fourth pixel arrays PXA1 to PXA4 in a closed-loop shape, and each of the second inorganic patterns IPT2 may be separate from each other in a plan view.

The first inorganic pattern IPT1 and the second inorganic pattern IPT2 each may include a layer including an inorganic insulating material, and as described below, may be formed to have a less height than each of the first organic pattern OPT1 and the second organic pattern OPT2, in a cross-sectional view. Thus, the expression "surrounding" used above may denote a shape in a plan view, and the first inorganic pattern IPT1 and the second inorganic pattern IPT2 may be arranged at bottom surfaces of first and second corner holes CH1 and CH2 at a location at which the first inorganic pattern IPT1 and the second inorganic pattern IPT2 overlap the first corner hole CH1 (FIG. 8A) defined in the second organic insulating layer 116 between the pixel array and the first organic pattern OPT1 and the second corner hole CH2 (FIG. 8A) defined in the second organic insulating layer 116 between the first organic pattern OPT1 and the second organic pattern OPT2.

The first inorganic pattern IPT1 and the second inorganic pattern IPT2 may not be arranged in the spaced area SA of the central corner area CCA. Thus, the spaced area SA may be an area, in which the components of the display panel 10 including the first and second inorganic patterns IPT1 and IPT2 are not arranged, except for the substrate 100.

A third inorganic pattern IPT3 may further be arranged between the second organic pattern OPT2 and the third organic pattern OPT3 in the first and second adjacent corner areas ACA1 and ACA2. The third inorganic patterns IPT3 may surround the extension portions OPT2-E of the second organic patterns OPT2 of the pixel arrays arranged in the first and second adjacent corner areas ACA1 and ACA2 and may be connected to each other. In an embodiment, the third inorganic patterns IPT3 may be connected to each other between the third pixel array PXA3 and the fourth pixel array PXA4 in a plan view, for example.

Referring to FIG. 7, the third inorganic pattern IPT3 may include a first portion P1, a curve portion CP, and a second portion P2. The first portion P1 may be a portion connected to the third inorganic pattern IPT3 of the third pixel array PXA3, the second portion P2 may be a portion connected to the third inorganic pattern IPT3 of the fourth pixel array PXA4, and the curve portion CP may be a portion connecting the first portion P1 with the second portion P2 and the portion at which an extension direction of the third inorganic pattern IPT3 changes. When the portion at which the extension direction changes bends, stress may be concentrated in the bent portion. However, in the case of the pixel arrays arranged in the first and second adjacent corner areas ACA1 and ACA2, instead of defining the spaced area SA as in the central corner area CCA, a connecting end of the third inorganic pattern IPT3 may be formed as a curve to reduce the stress concentration applied at the connecting end. FIG. 7 illustrates that the curve portion CP, which is the connecting end of the third inorganic pattern IPT3, may have a round shape. However, the curve portion CP may be formed to be winding or concavo-convex. That is, the curve portion CP may be formed to have a serpentine shape.

A fourth inorganic pattern IPT4 surrounding the middle corner area MCA may further be arranged between the connection portion OPT2-C of the second organic pattern OPT2 and the fourth organic pattern OPT4, a fifth inorganic pattern IPT5 apart from the fourth inorganic pattern IPT4 and surrounding the middle corner area MCA may further be arranged between the fourth organic pattern OPT4 and the fifth organic pattern OPT5, and a sixth inorganic patter IPT6 apart from the fifth inorganic pattern IPT5 and surrounding the middle corner area MCA may further be arranged between the fifth organic pattern OPT5 and the middle corner area MCA.

FIG. 8A is a schematic cross-sectional view of the display panel 10 of FIG. 7, taken along line G-G', FIG. 8B is an enlarged view of region H of the display panel 10 of FIG. 8A, FIG. 8C is an enlarged view of region I of the display panel 10 of FIG. 8A, and FIG. 8D is an enlarged view of region J of the display panel 10 of FIG. 8A.

FIGS. 8A to 8D are cross-sectional views illustrating portions of the central corner area CCA and the first adjacent corner area of FIGS. 6 and 7 by including the encapsulation layer ENL, and thus, the same features of the components indicated by the same reference numerals as FIGS. 6 and 7 are not to be repeatedly described. Also, the members including the same features as the central area CA and the middle corner area MCA of FIG. 5 are not to be repeatedly described.

Referring to FIGS. 8A to 8D along with FIG. 8A, the display panel 10 may include the substrate 100, the pixel circuit layer PCL, the display element layer DEL, and the encapsulation layer ENL.

The substrate 100 may include the first base layer 100a, the first barrier layer 100b, the second base layer 100c, and the second barrier layer 100d, and the pixel circuit layer PCL may include the pixel circuit PC including at least one thin-film transistor.

The pixel circuit layer PCL may include the inorganic insulating layer IIL, the first organic insulating layer 115, and the second organic insulating layer 116 arranged below or/and above components of the thin-film transistor, and the inorganic insulating layer IIL may include the buffer layer 111, the first gate insulating layer 112, the second gate insulating layer 113, and the inter-insulating layer 114. The inorganic insulating layer IIL may be arranged between the substrate 100 and the organic light-emitting diode OLED, which is a display element, and the first organic insulating layer 115 and the second organic insulating layer 116 may be arranged between the inorganic insulating layer IIL and the organic light-emitting diode OLED.

The pixel circuit layer PCL may further include a lower line LWL and an electrode power supply line ELVSSL.

The lower line LWL may transmit a power voltage and/or an electrical signal to the pixels PX arranged in the central corner area CCA and the first and second adjacent corner areas ACA1 and ACA2. The lower line LWL may include a first lower line LWL1 and a second lower line LWL2. The first lower line LWL1 may be arranged between the first gate insulating layer 112 and the second gate insulating layer 113, and the second lower line LWL2 may be arranged between the second gate insulating layer 113 and the inter-insulating layer 114.

The electrode power supply line ELVSSL may be arranged on the first organic insulating layer 115 like the connection electrode CML and may include the same material as that of the connection electrode CML. The electrode power supply line ELVSSL may be electrically connected to the opposite electrode 213 through a connection hole (not shown) defined at a tip end of each of the pixel arrays arranged in the central corner area CCA and the first and second adjacent corner areas ACA1 and ACA2 described above and may apply an electrical signal to the opposite electrode 213.

The second organic insulating layer 116 may be arranged on the electrode power supply line ELVSSL and the connection electrode CML. As illustrated in FIG. 8A, a first corner hole CH1, a second corner hole CH2, and a third corner hole CH3 may be defined in the second organic insulating layer 116.

In FIG. 8A, reference numerals of the first and second corner holes CH1 and CH2 are described only at a side adjacent to the first penetration area PA1 of the third pixel array PXA3. However, as illustrated in FIG. 8A, the first and second corner holes CH1 and CH2 may be symmetrically defined at a side far from the first penetration area PA1 of the third pixel array PXA3, and this feature may be likewise applied to other pixel arrays arranged in the central corner area CCA and the first and second adjacent corner areas ACA1 and ACA2. That is, the first corner hole CH1 may be defined in the second organic insulating layer 116 between an overlapping inorganic pattern OPT and a first upper inorganic pattern UIPT1, and the second corner hole CH2 may be defined in the second organic insulating layer 116 between the first upper inorganic pattern UIPT1 and a second upper inorganic pattern UIPT2. Also, in FIG. 8A, a reference numeral of the third corner hole CH3 is described only at a side of the third organic pattern OPT3 between the third pixel array PXA3 and the fourth pixel array PXA4. However, as illustrated in FIG. 8A, the third corner hole CH3 may also be defined at the other side of the third organic pattern OPT3, and this feature may be likewise applied to other pixel arrays arranged in the first and second adjacent corner areas ACA1 and ACA2. That is, the third corner hole CH3 may be defined between the second upper inorganic pattern UIPT2 and a third upper inorganic pattern UIPT3.

The first corner hole CH1 and the second corner hole CH2 may overlap the electrode power supply line ELVSSL, and the first inorganic pattern IPT1 and the second inorganic pattern IPT2 on the electrode power supply line ELVSSL may overlap the first corner hole CH1 and the second corner hole CH2, respectively. The first inorganic pattern IPT1 and the second inorganic pattern IPT2 may prevent or minimize damage to the electrode power supply line ELVSSL in a process of defining the first corner hole CH1 and the second corner hole CH2.

The third corner hole CH3 may overlap the third inorganic pattern IPT3 and may prevent or minimize damage to the first organic insulating layer 115 in a process of defining the first to third corner holes CH1 to CH3 in the second organic insulating layer 116.

The first to third inorganic patterns IPT1, IPT2, and IPT3 may include an inorganic insulating material, such as $SiO_2$, $SiN_x$, SiON, $Al_2O_3$, $TiO_2$, $Ta_2O_5$, $HfO_2$, and/or ZnO or $ZnO_2$.

The overlapping inorganic pattern COP, the first upper inorganic pattern UIPT1, the second upper inorganic pattern UIPT2, and the third upper inorganic pattern UIPT3 may be arranged on the second organic insulating layer 116.

The overlapping inorganic pattern COP, the first upper inorganic pattern UIPT1, the second upper inorganic pattern UIPT2, and the third upper inorganic pattern UIPT3 may include the same material as one another and may be simultaneously formed. The overlapping inorganic pattern COP, the first upper inorganic pattern UIPT1, the second upper inorganic pattern UIPT2, and the third upper inorganic pattern UIPT3 may include an inorganic insulating material, such as $SiO_2$, $SiN_x$, SiON, $Al_2O_3$, $TiO_2$, $Ta_2O_5$, $HfO_2$, and/or ZnO or $ZnO_2$.

The overlapping inorganic pattern COP may be arranged between the pixel electrode 211 and the second organic insulating layer 116 and may be arranged on an inner surface of a contact hole connecting the pixel electrode 211 with the connection electrode CML. The pixel electrode 211 may be arranged on the overlapping inorganic pattern COP and may be connected to the connection electrode CML through the contact hole.

The first upper inorganic pattern UIPT1 may be spaced apart from the overlapping inorganic pattern COP by the first corner hole CH1 and may have a shape surrounding the overlapping inorganic pattern COP in a plan view. The second upper inorganic pattern UIPT2 may be spaced apart from the first upper inorganic pattern UIPT1 by the second corner hole CH2 and may have a shape surrounding the first upper inorganic pattern UIPT1 in a plan view. The third upper inorganic pattern UIPT3 may be spaced apart from the second upper inorganic pattern UIPT2 by the third corner hole CH3 and may have a shape surrounding the second upper inorganic pattern UIPT2 in a plan view.

The first upper inorganic pattern UIPT1 and the second upper inorganic pattern UIPT2 may be formed in all of the pixels in the central corner area CCA and the first and second adjacent corner areas ACA1 and ACA2. However, the third upper inorganic pattern UIPT3 may not be arranged in the central corner area CCA and may be arranged only in the first and second adjacent corner areas ACA1 and ACA2.

Each of the first to third upper inorganic patterns UIPT1 to UIPT3 may include a corner protrusion tip CPT. In FIG. 8A, only the corner protrusion tip CPT formed in the overlapping inorganic pattern COP in the first corner hole CH1 of the fourth pixel array PXA4 is indicated. However, all of the upper inorganic patterns COP, UIPT1, UIPT2, and UIPT3 of each of the pixels in the central corner area CCA and the first and second adjacent corner areas ACA1 and ACA2 may include the corner protrusion tips CPT. FIG. 8C illustrates an embodiment in which the corner protrusion tip CPT is formed in each of the second upper inorganic pattern UIPT2 and the third upper inorganic pattern UIPT3 in the third corner hole CH3 between the third pixel array PXA3 and the fourth pixel array PXA4.

The pixel-defining layer 118 may cover an edge of the pixel electrode 211, and the spacer 119 (FIG. 5) may be formed on the pixel-defining layer 118. The first organic pattern OPT1, the second organic pattern OPT2, and the third organic pattern OPT3 may include the same material as that of the pixel-defining layer 118 and/or the spacer 119 (FIG. 5).

The first organic pattern OPT1 may include the same material as that of the pixel-defining layer 118 and may be arranged on the first upper inorganic pattern UIPT1. The first organic pattern OPT1 and the first upper inorganic pattern UIPT1 together may form the first corner dam CD1. The second organic pattern OPT2 may include a first pattern 118P including the same material as that of the pixel-defining layer 118 and a second pattern 119P including the same material as that of the spacer 119 (FIG. 5) and may be arranged on the second upper inorganic pattern UIPT2. The second organic pattern OPT2 and the second upper inorganic pattern UIPT2 together may form the second corner dam CD2. The second organic pattern OPT2 may additionally include the second pattern 119P, compared with the first organic pattern OPT1, and thus, a thickness of the second organic pattern OPT2 may be greater than a thickness of the first organic pattern OPT1 in a thickness direction (the third direction ±z). The first corner dam CD1 and the second corner dam CD2 may limit the organic encapsulation layer 320 formed in the first to fourth pixel arrays PXA1 to PXA4 not to exceed the second corner dam CD2, similarly with the functions of the first organic pattern OPT1 and the second organic pattern OPT2 described above. Thus, the organic encapsulation layer 320 formed in the first to fourth pixel arrays PXA1 to PXA4 may be separately formed for each of the first to fourth pixel arrays PXA1 to PXA4.

The third organic pattern OPT3 may include the first pattern 118P including the same material as that of the pixel-defining layer 118 and the second pattern 119P including the same material as that of the spacer 119 (FIG. 5) and may be arranged on the third upper inorganic pattern UIPT3. The third organic pattern OPT3 may be arranged only in the first and second adjacent corner areas ACA1 and ACA2, and as described above, the third organic patterns OPT3 may be connected to each other between the adjacent pixel arrays in a plan view.

The intermediate layer 212 may be arranged on the pixel-defining layer 118. Referring to FIG. 8B, the intermediate layer 212 may include the emission layer 212b arranged in an opening of the pixel-defining layer 118 and overlapping the pixel electrode 211. The intermediate layer 212 may further include at least one of the first functional layer 212a arranged between the pixel electrode 211 and the emission layer 212b and the second functional layer 212c arranged on the emission layer 212b.

Referring to FIG. 8C, the second upper inorganic pattern UIPT2 may include the corner protrusion tip CPT protruding toward a center of the third corner hole CH3. Also, the third upper inorganic pattern UIPT3 may include the corner protrusion tip CPT protruding toward a center of the third corner hole CH3. Accordingly, when the first and second functional layers 212a and 212c are formed, the first functional layer 212a may be separated from the second functional layer 212c by the corner protrusion tips CPT of the second and third upper inorganic patterns UIPT2 and UIPT3, and thus, a functional layer pattern 212P, which is a separating pattern of the first and second functional layers 212a and 212c, may be formed in the third corner hole CH3. Although not shown in FIG. 8C, a functional layer pattern may be likewise formed in the first corner hole CH1 and the second corner hole CH2 as the third corner hole CH3.

The opposite electrode 213 may be formed on the pixel-defining layer 118 and the intermediate layer 212 to correspond to the plurality of pixel electrodes 211. Thus, for the same reason that the functional layer pattern 212P may be formed in the first to third corner holes CH1 to CH3, a common electrode pattern 213P may be formed in the first to third corner holes CH1 to CH3.

The first inorganic encapsulation layer 310 included in the encapsulation layer ENL may be arranged on the opposite electrode 213. Referring to FIG. 8C, the first inorganic encapsulation layer 310 having an excellent step coverage may cover an inner surface of the third corner hole CH3 and may contact the corner protrusion tip CPT, to continually cover an inner surface of an upper space of the corner protrusion tip CPT. Like the third corner hole CH3, in the case of the first and second corner holes CH1 and CH2, the first inorganic encapsulation layer 310 may continually cover inner surfaces, the corner protrusion tips CPT, and upper spaces of the corner protrusion tips CPT of the first and second corner holes CH1 and CH2.

The organic encapsulation layer 320 included in the encapsulation layer ENL may be arranged on the first inorganic encapsulation layer 310, and referring to FIG. 8A, the organic encapsulation layer 320 may fill inner spaces of the first and second corner holes CH1 and CH2. Thus, the organic encapsulation layer 320 may be formed not to exceed the second corner dam CD2 or the second organic pattern OPT2. However, because the organic encapsulation layer 320 may not exceed the second organic pattern OPT2, the third corner hole CH3 may not be filled with the organic encapsulation layer 320, with reference to FIG. 8C.

The second inorganic encapsulation layer 330 included in the encapsulation layer ENL may be arranged on the organic encapsulation layer 320. The second inorganic encapsulation layer 330 may directly contact the first inorganic encapsulation layer 310 above and outside the second corner dam CD2. Referring to FIG. 8C, in the third corner hole CH3 not filled with the organic encapsulation layer 320, the second inorganic encapsulation layer 330 may directly contact the first inorganic encapsulation layer 310.

Thus, the first inorganic encapsulation layer 310 may entirely and continually cover the central corner area CCA and the first and second adjacent corner areas ACA1 and ACA2 and may serve as a barrier for the penetration of external water. Thus, the reliability of the display panel 10 may be improved. Also, the second inorganic encapsulation layer 330 may cover the organic encapsulation layer 320 and may entirely and continually cover the central corner area CCA and the first and second adjacent corner areas ACA1 and ACA2, and thus, the reliability of the display panel 10 may further be improved.

Referring to FIG. 8D, between the extension areas EA (FIG. 7) including the first pixel array PXA1 and the second pixel array PXA2 arranged in the central corner area CCA, only the substrate 100 may be arranged, and the components of the display panel 10, such as the pixel circuit layer PCL including the pixel circuit PC, the inorganic insulating layer IIL, and the first and second organic insulating layers 115 and 116, the display element layer DEL, and the organic encapsulation layer 320, may not be arranged. However, the first inorganic encapsulation layer 310 and the second inorganic encapsulation layer 330 may be arranged. Thus, in the illustrated embodiment, the spaced area SA may be an area, in which the components of the display panel 10, except for the substrate 100 and the first and second inorganic encapsulation layers 310 and 330, may not be arranged. Thus, in the extension areas EA (FIGS. 6 and 7) arranged to be adjacent to each other in the central corner area CCA, the pixel circuit layer PCL including the pixel circuit PC, the inorganic insulating layer IIL, and the first and second organic insulating layers 115 and 116, the display element layer DEL, and the organic encapsulation layer 320 described above may not be connected in the spaced area SA, and the substrate 100 and the first and second inorganic encapsulation layers 310 and 330 may be connected in the spaced area SA.

Between the third pixel array PXA3 and the fourth pixel array PXA4 arranged in the first adjacent corner area ACA1, the substrate 100, the inorganic insulating layer IIL, the first organic insulating layer 115, the third inorganic pattern IPT3, the third organic pattern OPT3, the first and second inorganic encapsulation layers 310 and 330, etc., may be arranged. Thus, the spaced area SA may not be defined between the third pixel array PXA3 and the fourth pixel array PXA4.

All of the components of the display panel 10 including the substrate 100 may not be arranged between the first pixel array PXA1 in the central corner area CCA and the third pixel array PXA3 in the first adjacent corner area ACA1. Thus, the first pixel array PXA1 in the central corner area CCA and the third pixel array PXA3 in the first adjacent corner area ACA1 may be separated from each other by the first penetration area PA1, and the components of the display panel 10 describe above may not be connected in the first penetration area PA1.

Thus, in the case of the pixel arrays in the central corner area CCA more greatly affected by the compressive strain than the first and second adjacent corner areas ACA1 and ACA2, the extension areas EA may be formed in a direction away from the central area CA, and at the same time, the spaced area SA, from which one or more components of the display panel 10 are removed, may be defined between the extension areas EA, to minimize the compressive strain. Also, the first and second penetration areas PA1 and PA2, from which all of the components of the display panel 10 including the substrate 100 are removed, may be respectively defined between the central corner area CCA and the first adjacent corner area ACA1 and between the central corner area CCA and the second adjacent corner area ACA2, most greatly affected by the compressive strain, and thus, the compressive strain may be minimized. Also, the width W1 of the first and second penetration areas PA1 and PA2 may be greater than the width W2 of the spaced area SA, and thus, the compressive strain applied between the central corner area CCA and the first adjacent corner area ACA1 and between the central corner area CCA and the second adjacent corner area ACA2 may further be reduced.

FIG. 9A is a schematic cross-sectional view of another embodiment of the display panel 10 of FIG. 7, taken along line G-G', and FIG. 9B is an enlarged view of region K of the display panel 10 of FIG. 9A. In FIGS. 9A and 9B, the same features of the components indicated by the same reference numerals as FIGS. 8A to 8D are not to be repeatedly described.

Referring to FIGS. 9A and 9B, a neutral plane adjustment layer NPC may further be arranged above the encapsulation layer ENL and on the substrate 100 in the spaced area SA.

The neutral plane adjustment layer NPC may include a material having a higher modulus than a modulus of a material of the encapsulation layer ENL. In an embodiment, the modulus of the neutral plane adjustment layer NPC may be greater than or equal to about 0.5 gigapascal (GPa) and less than or equal to about 3 GPa, and more desirably, greater than or equal to about 0.8 GPa and less than or equal to about 1.5 GPa, for example. In an embodiment, the neutral plane adjustment layer NPC may include at least one of polyethylene terephthalate ("PET"), polyimide, polyethylene naphthalate, polyarylate, polycarbonate, polyether imide ("PEI"), and polyethersulfone. Also, the neutral plane adjustment layer NPC may be an optical layer, such as a polarization layer having a high modulus.

Because the second organic insulating layer 116, the first organic insulating layer 115, and the inorganic insulating layer IIL may be removed from the first and second penetration areas PA1 and PA2 and the spaced area SA, a neutral plane of the central corner area CCA and the first and second adjacent corner areas ACA1 and ACA2 may descend. Thus, when the central corner area CCA and the first and second adjacent corner areas ACA1 and ACA2 bend, stress may be concentrated at the encapsulation layer ENL, and cracks may occur in the encapsulation layer ENL.

In an embodiment, the neutral plane adjustment layer NPC including a material having a higher modulus than a modulus of a material of the encapsulation layer ENL may be formed above the encapsulation layer ENL, and thus, the neural plane of the central corner area CCA and the first and second adjacent corner areas ACA1 and ACA2 may ascend. Thus, when the central corner area CCA and the first and second adjacent corner areas ACA1 and ACA2 are curved by a plurality of curvatures, stress at the encapsulation layer ENL may be alleviated to reduce cracks in the encapsulation layer ENL.

When there is no substrate 100 in the spaced area SA, the neural plane adjustment layer NPC may have to be formed on the encapsulation layer ENL along the extension areas EA (FIG. 6) having apart stripe-shapes, and thus, high patterning precision may be desired. However, when the substrate 100 remains in the spaced area SA, even when the material of the neutral plane adjustment layer NPC exceeds from the encapsulation layer ENL, the exceeding material may be accommodated on the substrate 100 in the spaced area SA, and thus, the patterning difficulty may be reduced. In an embodiment, the neutral plane adjustment layer NPC may be formed by an inkjet process, for example.

Thus, in an embodiment, the neutral plane adjustment layer NPC may be additionally arranged above the encapsulation layer ENL and on the substrate 100 in the spaced area SA, and thus, damage due to the descending of the neutral plane may be minimized, and the processing diffi-culty may be reduced. Therefore, the processing operability may be improved.

FIG. 10A is a schematic cross-sectional view of the display panel 10 of FIG. 7, taken along line G-G', in another embodiment, and FIG. 10B is an enlarged view of region L of the display panel 10 of FIG. 10A. In FIGS. 10A and 10B, the same features of the components indicated by the same reference numerals as FIGS. 8A to 8D are not to be repeatedly described Referring to FIGS. 10A and 10B, an additional connection line ACL may further be arranged on the substrate 100 in the spaced area SA. The additional connection line ACL may be formed in a direction crossing the extension direction of the extension areas EA (FIG. 6).

When the pixel arrays including the plurality of pixels PX (FIG. 6) are formed in the extension areas EA (FIG. 6), various lines which drive the plurality of pixels may be arranged together. When the substrate 100 is not arranged in the spaced area SA, the entirety of the lines may have to be arranged in the extension areas EA (FIG. 6). However, when the substrate 100 is arranged in the spaced area SA, one or more lines may be arranged on the substrate 100 in the spaced area SA.

In an embodiment, when a scan line extends in the extension direction (or a longitudinal direction) of the extension areas EA or a direction away from the central area CA (FIG. 6), one or more data lines may be arranged on the substrate 100 in the spaced area SA. Thus, as the number of lines arranged in the extension areas EA is reduced, an area of the emission area may be increased, as desired to match the reduced number of lines. Thus, the resolution may be increased. Also, in the case of lines desired to be designed in directions crossing each other, such as the scan lines and the data lines, an area to arrange the data lines in the direction crossing the extension direction of the extension areas EA (FIG. 6) may be obtained on the substrate 100 in the spaced area SA, and thus, it may be made easy to design the lines. Also, by arranging the lines in the direction crossing the extension direction of the extension areas EA (FIG. 6), the compressive strain applied to the spaced area SA may be alleviated.

According to the embodiment described above, the scan lines and the data lines are described as an example. How-ever, the disclosure is not limited thereto, and other lines may also be applied as the additional connection line ACL. Also, FIG. 10B illustrates a structure in which the additional connection line ACL may be arranged on the inorganic insulating layer IIL. However, the additional connection line ACL may be directly arranged on the substrate 100, e.g., the second barrier layer 100*d*, and at least one inorganic layer from among the plurality of inorganic layers 111, 112, 113, and 114 included in the inorganic insulating layer IIL may further be omitted.

FIG. 11A is an enlarged view of region E of the display panel 10 of FIG. 3, in another embodiment, FIG. 11B is an enlarged view of region M of the display panel 10 of FIG. 11A, and FIG. 11C is a schematic cross-sectional view of the display panel 10 of FIG. 11B, taken along line N-N'. In FIGS. 11A to 11C, the same features of the components indicated by the same reference numerals as FIGS. 6 and 7 and FIGS. 8A to 8D are not to be repeatedly described Referring to FIGS. 11A to 11C, the central corner area CCA may be arranged between the first adjacent corner area ACA1 and the second adjacent corner area ACA2, and the central corner area CCA may include the plurality of exten-sion areas EA extending in a direction away from the central area CA.

The first adjacent corner area ACA1 may be adjacent to a side of the central corner area CCA, and the second adjacent corner area ACA2 may be adjacent to the other side of the central corner area CCA.

The central corner area CCA and the first adjacent corner area ACA1 may be spaced apart from each other by the first penetration area PA1, and the central corner area CCA and the second adjacent corner area ACA2 may be spaced apart from each other by the second penetration area PA2. The first penetration area PA1 and the second penetration area PA2 may be empty areas of the display panel 10. That is, the first penetration area PA1 and the second penetration area PA2 may be areas, in which the components of the display panel 10 (e.g., the substrate 100 of the display panel 10) are not arranged. Thus, the compressive strain at areas between the central corner area CCA and the first adjacent corner area ACA1 and between the central corner area CCA and the second adjacent corner area ACA2, i.e., at the areas being most greatly affected by the compressive strain, may be minimized.

Ends of the extension areas EA adjacent to each other in the central corner area CCA may be spaced apart from each other by a first spaced area SA1 or a second spaced area SA2. In an embodiment, the first spaced area SA1 may be arranged between the first pixel array PXA1 and the second pixel array PXA2, and the second spaced area SA2 may be arranged between the second pixel array PXA2 and a fifth pixel array PXA5, for example.

Like the spaced area SA illustrated in FIG. 6, the first spaced area SA1 may be an area, in which the components of the display panel 10, except for the substrate 100, are not arranged. However, as illustrated in FIG. 8A, the first inorganic encapsulation layer 310 and the second inorganic encapsulation layer 330 of the encapsulation layer ENL may further be arranged on the substrate 100. The second spaced area SA2 may be an empty area of the display panel 10, like the first and second penetration areas PA1 and PA2. That is, the second spaced area SA2 may be an area, in which the components of the display panel 10 including the substrate 100 are not arranged. Unlike the embodiment of FIG. 6, the second spaced area SA2, from which the substrate 100 is removed, may be added between the extension areas EA, and thus, the compressive strain applied to the central corner area CCA may further be reduced.

The width W1 of each of the first and second penetration areas PA1 and PA2 may be greater than the width W2 of the first spaced area SA1 and a width W3 of the second spaced area SA2. Thus, the compressive strain applied between the central corner area CCA and the first adjacent corner area ACA1 and between the central corner area CCA and the second adjacent corner area ACA2 may further be reduced.

Also, the width W2 of the first spaced area SA1 may be greater than the width W3 of the second spaced area SA2. The first spaced area SA, which may be more greatly affected by the compressive strain than the second spaced area SA2, in which the substrate 100 is not arranged, may have the width W2, which is greater than the width W3 of the second spaced area SA2, and thus, a deviation of the compressive strain applied to the central corner area CCA may be reduced. Also, the first spaced area SA1 and the second spaced area SA2 may be symmetrically arranged based on the central corner area CCA, and thus, the devia-tion of the compressive strain applied to the central corner area CCA may be reduced, and damage caused by the compressive strain may be minimized.

The illustrated embodiment is not limited to the illustrations in FIGS. 11A to 11C. The first spaced area SA1 may be an area, in which the neutral plane adjustment layer NPC may further be arranged on the substrate 100, as illustrated in FIGS. 9A and 9B. Thus, the first spaced area SA1 and the second spaced area SA2 may be arranged between the extension areas EA arranged in the central corner area CCA, and the neutral plane adjustment layer NPC may further be arranged above the encapsulation layer ENL of the central corner area CCA and the first and second adjacent corner areas ACA1 and ACA2 and on the substrate 100 in the first spaced area SA1. Thus, damage due to descending of a neutral plane may be minimized, and the processing difficulty may be reduced, and thus, the processing operability may be improved.

The first spaced area SA1 may be an area, in which the additional connection line ACL may further be arranged on the substrate 100, as illustrated in an embodiment of FIGS. 10A and 10B. Thus, the first spaced area SA1 and the second spaced area SA2 may be arranged between the extension areas EA arranged in the central corner area CCA, and the additional connection line ACL may further be arranged on the substrate 100 in the first spaced area SA1. Thus, the resolution of the central corner area CCA may be increased, line designing may be made easy, and the compressive strain applied to the first spaced area SA1 may be reduced.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

As described above, in the display panel and the display apparatus according to embodiments, widths of the first and second penetration areas between the central corner area and the first and second adjacent corner areas adjacent to opposite ends of the central corner area extending in a direction away from the central area, may be greater than a width of the spaced area between the plurality of extension areas in the central corner area. Thus, when the corner area bends by a plurality of curvatures, stress between the central corner area and the first and second adjacent corner areas may be reduced, and thus, the reliability of the display panel and the display apparatus may be improved.

It should be understood that embodiments described herein should be considered in a descriptive sense only and not for purposes of limitation. Descriptions of features or advantages within each embodiment should typically be considered as available for other similar features or advantages in other embodiments. While embodiments have been described with reference to the drawing figures, it will be understood by those of ordinary skill in the art that various changes in form and details may be made therein without departing from the spirit and scope as defined by the following claims.

What is claimed is:

1. A display apparatus comprising:
a substrate;
a central area comprising a first display element and arranged at a center of the substrate; and a corner area comprising a second display element and arranged at a corner of the central area, the corner area further comprising:
a central corner area comprising a plurality of extension areas extending in a direction away from the central area; and
a first adjacent corner area and a second adjacent corner area respectively arranged at opposite sides of the central corner area,
wherein the plurality of extension areas is spaced apart from each other by a spaced area in which the substrate is arranged and which does not connect the plurality of extension areas, and
the central corner area and the first adjacent corner area are spaced apart from each other by a first penetration area in which the substrate is not arranged and which does not connect the central corner area and the first adjacent corner area, and the central corner area and the second adjacent corner area are spaced apart from each other by a second penetration area in which the substrate is not arranged and which does not connect the central corner area and the second adjacent corner area.

2. The display apparatus of claim 1, wherein a width of each of the first penetration area and the second penetration area is greater than a width of the spaced area.

3. The display apparatus of claim 1, further comprising an encapsulation layer arranged on the first and second display elements and comprising an inorganic encapsulation layer and an organic encapsulation layer,
wherein the organic encapsulation layer is unitary in the central area and includes separated portions in the central corner area and the first and second adjacent corner areas.

4. The display apparatus of claim 1, further comprising:
an inorganic insulating layer arranged between the substrate and the first and second display elements;
a first organic insulating layer arranged between the inorganic insulating layer and the first and second display elements; and
a second organic insulating layer arranged between the first organic insulating layer and the first and second display elements,
wherein the inorganic insulating layer, the first organic insulating layer, and the second organic insulating layer are not connected in the first and second penetration areas and the spaced area.

5. The display apparatus of claim 4, wherein the second display element comprises a plurality of display elements,
the plurality of display elements is arranged in the plurality of extension areas, and in each of the plurality of extension areas,
a first organic pattern arranged on the second organic insulating layer and surrounding the plurality of display elements in a plan view and
a second organic pattern arranged on the second organic insulating layer to be apart from the first organic pattern and surrounding the first organic pattern in the plan view are arranged.

6. The display apparatus of claim 5, wherein a thickness of the second organic pattern is greater than a thickness of the first organic pattern.

7. The display apparatus of claim 5, wherein the second organic patterns surrounding extension areas which are most adjacent to each other from among the plurality of extension areas are apart from each other in the spaced area.

8. The display apparatus of claim 5, wherein, in the plan view, a first inorganic pattern arranged between the plurality of display elements and the first organic pattern and a second inorganic pattern arranged between the first organic pattern and the second organic pattern are further arranged in each of the plurality of extension areas, and based on a circumferential surface of the substrate, a height of each of the first and second organic patterns is greater than a height of each of the first and second inorganic patterns.

9. The display apparatus of claim 5, wherein, in each of the plurality of extension areas, a first inorganic encapsulation layer, an organic encapsulation layer, and a second inorganic encapsulation layer are sequentially stacked on the plurality of display elements, wherein the organic encapsulation layer is arranged in the second organic pattern, and organic encapsulation layers adjacent to each other in the plurality of extension areas are not connected to each other.

10. The display apparatus of claim 9, wherein, in the spaced area, the first inorganic encapsulation layer and the second inorganic encapsulation layer are arranged on the substrate connecting extension areas which are most adjacent to each other among the plurality of extension areas, and the first inorganic encapsulation layer and the second inorganic encapsulation layer directly contact each other.

11. The display apparatus of claim 3, wherein a neutral plane adjustment layer is further arranged above the encapsulation layer of each of the plurality of extension areas and on the substrate of the spaced area, and the neutral plane adjustment layer includes a material having a higher modulus than a modulus of a material of the encapsulation layer.

12. The display apparatus of claim 11, wherein, between the substrate of the spaced area and the neutral plane adjustment layer, an inorganic layer is further arranged.

13. The display apparatus of claim 3, further comprising an additional connection line arranged on the substrate of the spaced area.

14. The display apparatus of claim 13, wherein the additional connection line is arranged in a direction crossing a longitudinal direction of an extension area of the plurality of extension areas.

15. The display apparatus of claim 3, further comprising a middle corner area arranged between the central area and the corner area and comprising a third display element, wherein the encapsulation layer is further arranged on the third display element, and the organic encapsulation layer is unitary in the central area and the middle corner area and includes the separated portions in the central corner area and the first and second adjacent corner areas.

16. A display apparatus comprising:
a substrate;
a central area comprising a first display element and arranged at a center of the substrate; and
a corner area comprising a second display element and arranged at a corner of the central area, the corner area further comprising:
a central corner area comprising:
a plurality of extension areas extending in a direction away from the central area, the plurality of extension areas comprising at least one of a first extension area, a second extension area, and a third extension area; and a first adjacent corner area and a second adjacent corner area respectively arranged at opposite sides of the central corner area, wherein the first extension area and the second extension area are spaced apart from each other by a first spaced area in which the substrate is arranged and which does not connect the first extension area and the second extension area, and the second extension area and the third extension area are spaced apart from each other by a second spaced area in which the substrate is not arranged and which does not connect the second extension area and the third extension area, and the central corner area and the first adjacent corner area are spaced apart from each other by a first penetration area in which the substrate is not arranged and which does not connect the central corner area and the first adjacent corner area, and the central corner area and the second adjacent corner area are spaced apart from each other by a second penetration area in which the substrate is not arranged and which does not connect the central corner area and the second adjacent corner area.

17. The display apparatus of claim 16, wherein a width of each of the first penetration area and the second penetration area is greater than a width of the first spaced area and a width of the second spaced area.

18. The display apparatus of claim 17, wherein the width of the first spaced area is greater than the width of the second spaced area.

19. The display apparatus of claim 16, further comprising an encapsulation layer arranged on the first and second display elements and comprising an inorganic encapsulation layer and an organic encapsulation layer, wherein the organic encapsulation layer is unitary in the central area and includes separated portions in the central corner area and the first and second adjacent corner areas.

20. The display apparatus of claim 16, further comprising an encapsulation layer arranged on the first and second display elements and comprising an inorganic encapsulation layer and an organic encapsulation layer, wherein the organic encapsulation layer is unitary in the central area and includes separated portions in the central corner area and the first and second adjacent corner areas, and the inorganic encapsulation layer is arranged on the substrate in the first spaced area and is connected in the central corner area and the first and second adjacent corner areas.

21. The display apparatus of claim 20, wherein a neutral plane adjustment layer is further arranged above the encapsulation layer of each of the plurality of extension areas and on the substrate of the first spaced area, and the neutral plane adjustment layer includes a material having a higher modulus than a modulus of a material of the encapsulation layer.

22. The display apparatus of claim 20, further comprising an additional connection line arranged on the substrate of the first spaced area.

23. The display apparatus of claim 22, wherein the additional connection line is arranged in a direction crossing a longitudinal direction of an extension area of the plurality of extension areas.

24. The display apparatus of claim 16, further comprising a middle corner area arranged between the central area and the corner area and comprising a third display element, wherein an encapsulation layer is further arranged on the third display element, and the organic encapsulation layer is unitary in the central area and the middle corner area and includes separated portions in the central corner area and the first and second adjacent corner areas.

25. A display apparatus comprising:

a substrate;

an inorganic insulating layer arranged on the substrate;

a first organic insulating layer arranged on the inorganic insulating layer;

a second organic insulating layer which is arranged on the first organic insulating layer and in which a plurality of patterns spaced apart from each other by a plurality of corner holes is arranged;

a first pixel array to a fourth pixel array arranged on the second organic insulating layer and comprising a plurality of display elements;

a first organic pattern surrounding each of the first to fourth pixel arrays;

a plurality of second organic patterns surrounding the first organic pattern and apart from the first organic pattern; and an organic encapsulation layer arranged in a second organic pattern of the plurality of second organic patterns and separately arranged for each of the first to fourth pixel arrays, wherein a third organic pattern on the substrate is further arranged between adjacent second organic patterns of the first pixel array among the plurality of second organic patterns and a second pixel array, the substrate is not arranged between the adjacent second organic patterns of the second pixel array and the third pixel array, and the substrate is arranged and the third organic pattern is not arranged between the adjacent second organic patterns of the third pixel array and the fourth pixel array, wherein a distance between the second pixel array and the third pixel array is greater than a distance between the third pixel array and the fourth pixel array.

* * * * *